United States Patent [19]

Ohsawa

[11] Patent Number: 5,424,990
[45] Date of Patent: Jun. 13, 1995

[54] SEMICONDUCTOR MEMORY HAVING BUILT-IN VOLTAGE STRESS TEST MODE

[75] Inventor: Takashi Ohsawa, Yokohama, Japan

[73] Assignee: Kabushiki Kaisha Toshiba, Kawasaki, Japan

[21] Appl. No.: 175,537

[22] Filed: Dec. 30, 1993

[30] Foreign Application Priority Data

Mar. 10, 1993 [JP] Japan .................... 5-049699

[51] Int. Cl.6 .............................. G11C 7/00
[52] U.S. Cl. ................. 365/201; 365/230.01; 365/205; 365/207; 365/222
[58] Field of Search .......... 365/201, 205, 207, 230.01, 365/222

[56] References Cited

U.S. PATENT DOCUMENTS 4,651,304 3/1987 Takata ............................ 365/201
5,270,982 12/1993 Watanabe ....................... 365/201

FOREIGN PATENT DOCUMENTS 405576 1/1991 European Pat. Off. .
492610 7/1992 European Pat. Off. .
WO82/00917 3/1982 WIPO .

Primary Examiner—Joseph A. Popek
Assistant Examiner—F. Niranjan
Attorney, Agent, or Firm—Banner, Birch, McKie & Beckett

[57] ABSTRACT

There is provided a semiconductor memory with which the duty ratio of column selection lines can be raised as well as that of word lines so that the word lines and the column selection lines of the semiconductor memory may be subjected to a screening test along with the peripheral circuits under a same condition for all these components (in terms of electric field and time) while operating the peripheral circuits. The semiconductor memory comprises a memory circuit including a memory cell array and its peripheral circuits, a first circuit for selecting some of the word lines of the memory cell array, the first means being so adapted to select a greater number of word lines for a voltage stress test mode than for a normal operation mode and a second circuit for selecting some of the column selection lines CSL to thereby select the corresponding columns of the memory cell array, the second means being so adapted to select a greater number of column selection lines for a voltage stress test mode than for a normal operation mode.

29 Claims, 26 Drawing Sheets

NORMAL OPERATION
FIG. 5A  RACP
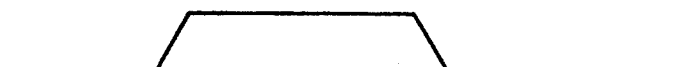
FIG. 5B  $\overline{RHLD}$
FIG. 5C  $\overline{RLTC}$
FIG. 5D  $\overline{RTRS}$
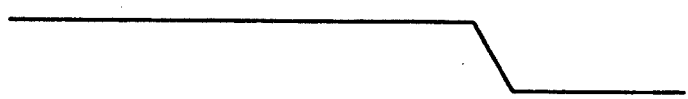
FIG. 5E  AIjR, $\overline{AIjR}$
FIG. 5F  CT
FIG. 5G  CTj, $\overline{CTj}$
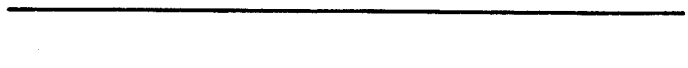
FIG. 5H  AjR, $\overline{AjR}$
FIG. 5I  BIT  "L"
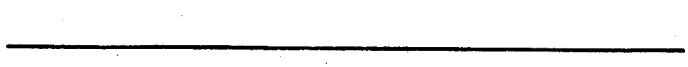

REFRESH OPERATION
FIG. 6A  RACP
FIG. 6B  $\overline{RHLD}$
FIG. 6C  $\overline{RLTC}$
FIG. 6D  $\overline{RTRS}$
FIG. 6E  AIjR, $\overline{AIjR}$
FIG. 6F  CT
FIG. 6G  CTj, $\overline{CTj}$
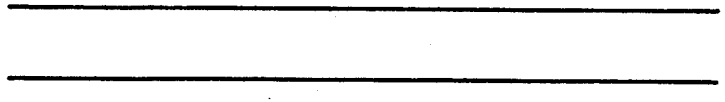
FIG. 6H  AjR, $\overline{AjR}$
FIG. 6I  BIT  "L"

AC BURN-IN TEST MODE OPERATION
FIG. 7A RACP
FIG. 7B $\overline{RHLD}$
FIG. 7C $\overline{RLTC}$
FIG. 7D $\overline{RTRS}$
FIG. 7E AIjR, $\overline{AIjR}$
FIG. 7F CT
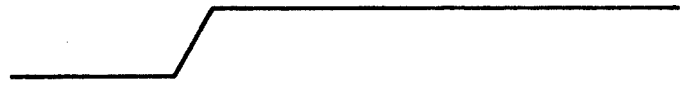
FIG. 7G j=2~10 CTj, $\overline{CTj}$
FIG. 7H j=2~10 AjR, $\overline{AjR}$
FIG. 7I BIT
"H"
FIG. 7J j=0,1 CTj, $\overline{CTj}$
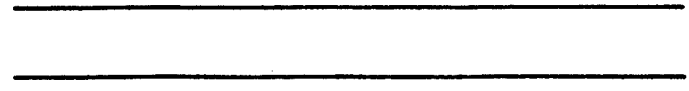
FIG. 7K j=0,1 Aj, $\overline{Aj}$

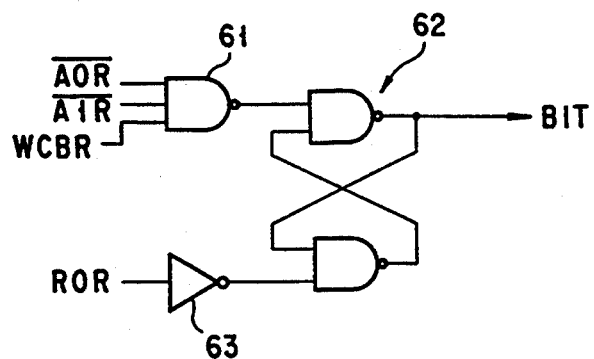
FIG. 8A
FIG. 8B $\overline{RAS}$
FIG. 8C $\overline{CAS}$
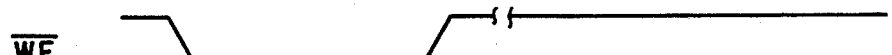
FIG. 8D $\overline{WE}$
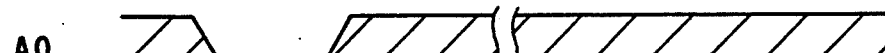
FIG. 8E A0
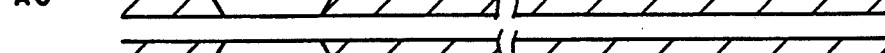
FIG. 8F A1
FIG. 8G WCBR
FIG. 8H ROR
FIG. 8I BIT

FIG.12A  AiR, $\overline{AiR}$
FIG.12B  $X_{Ai}, X_{Bj}$
FIG.12C  PRn, $\overline{PRn}$
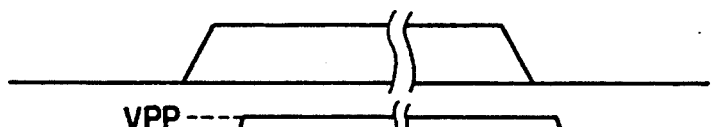
FIG.12D  $\overline{RSPn}$
FIG.12E  WDRVnj
FIG.12F  $\overline{WDRVnj}$
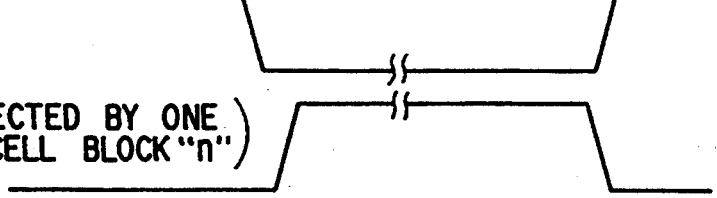
FIG.12G  WL (SELECTED BY ONE IN CELL BLOCK "n")
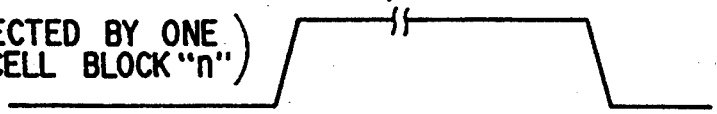

$i=0,1$ $AiR, \overline{AiR}$ $i=2\sim10$ $AiR, \overline{AiR}$ $X_A0 \sim X_A7$ $X_B0 \sim X_B7$ $PRn, \overline{PRn}$ $\overline{RSPn}$ WDRVnj $\overline{WDRVnj}$

WL (SELECTED EVERY FOUR WORD LINES)

FIG. 15A $\overline{CAS}$

FIG. 15B CLTC

FIG. 15C AINj

FIG. 15D AjC, $\overline{A}jC$

FIG. 15E BIT

FIG. 16A AjR, $\overline{A}jR$ j=0,1

FIG. 16B AjR, $\overline{A}jR$ j=2~10

FIG. 16C AjC, $\overline{A}jC$ j=0,1

FIG. 16D AjC, $\overline{A}jC$ j=2~10

FIG. 16E BIT

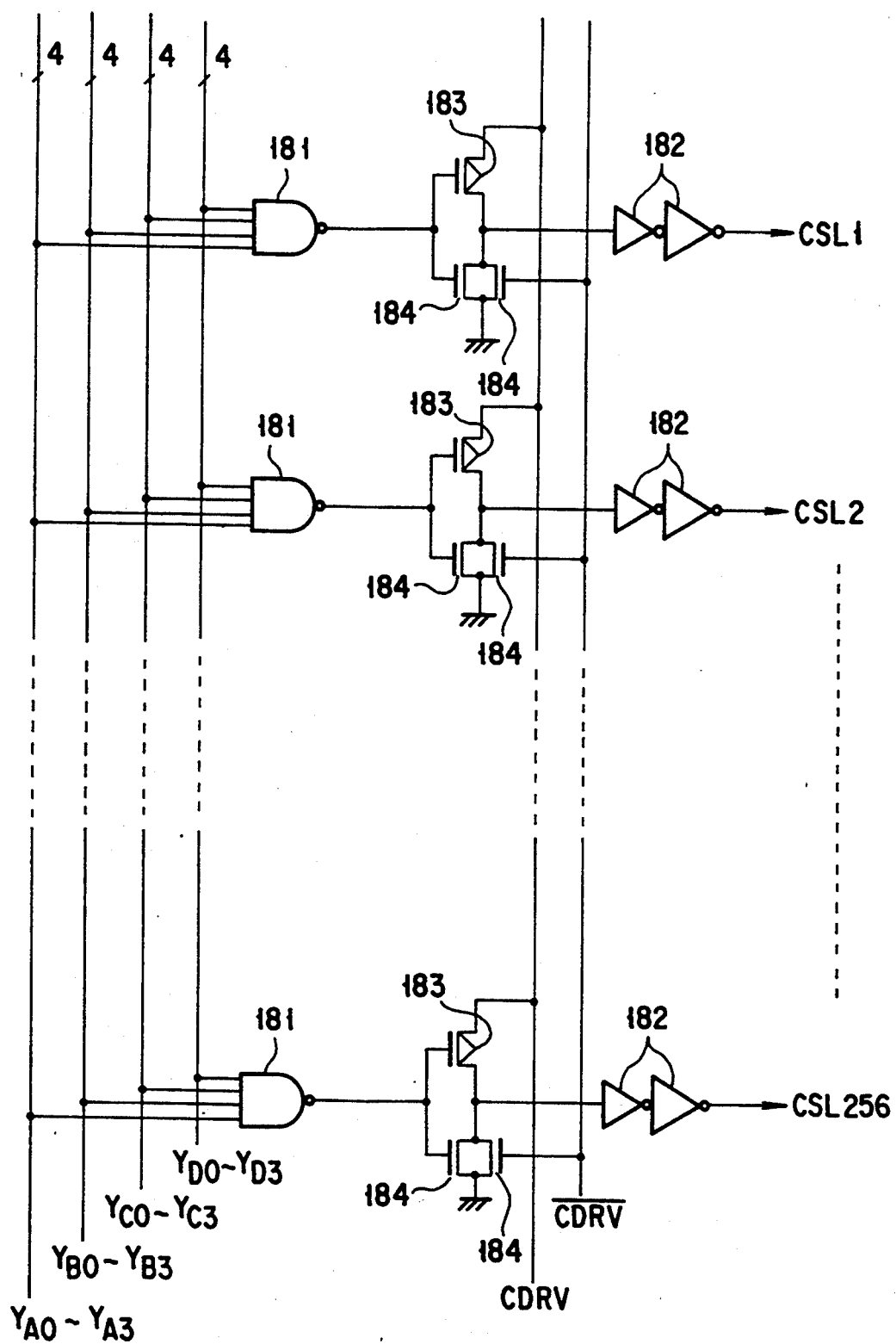
F I G. 18

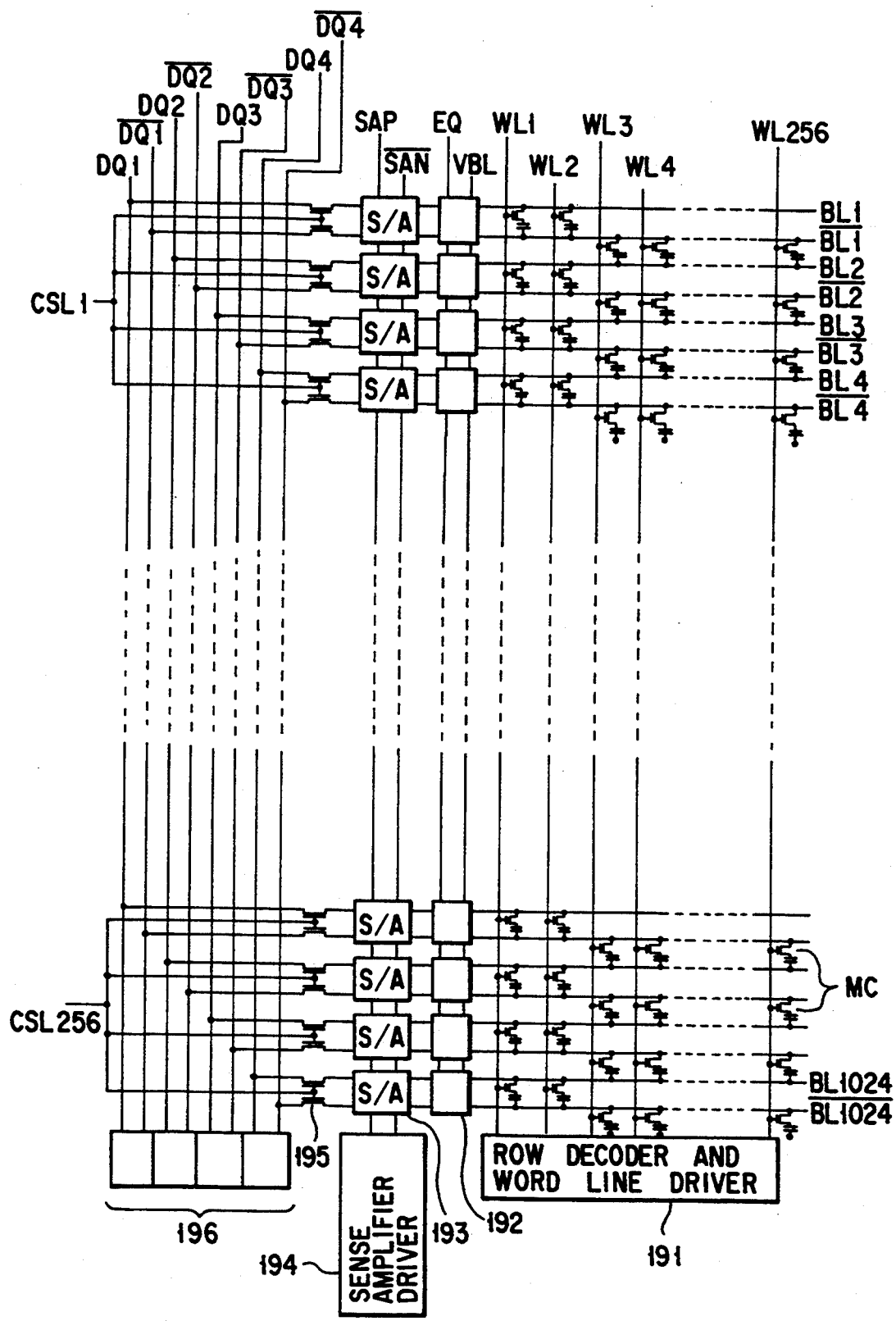
F I G. 19

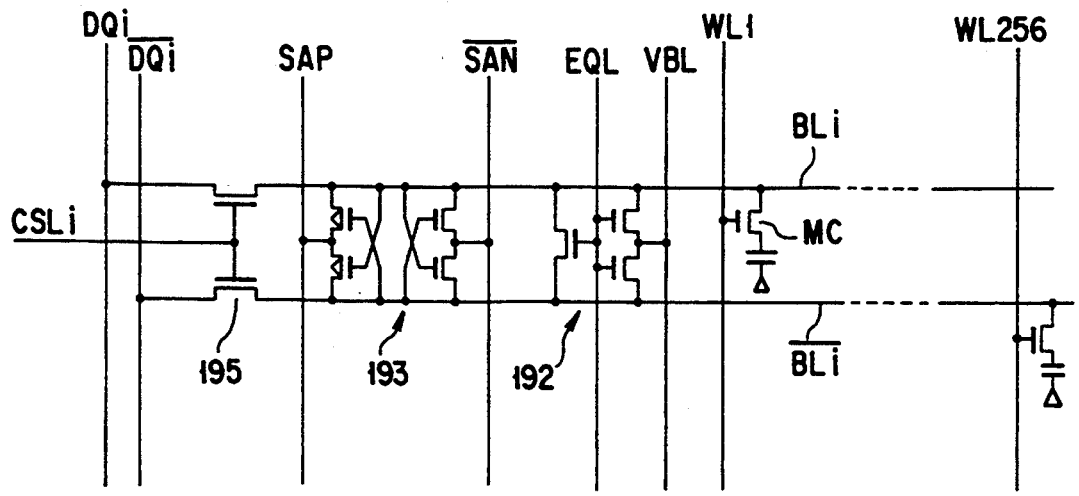
FIG. 20
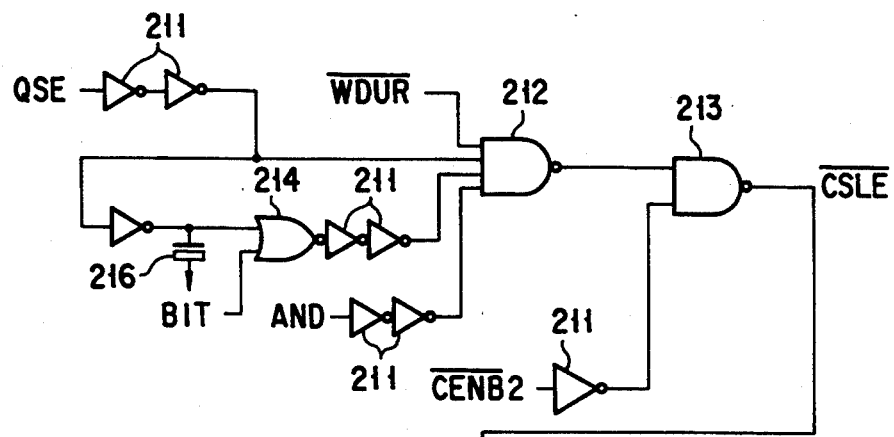
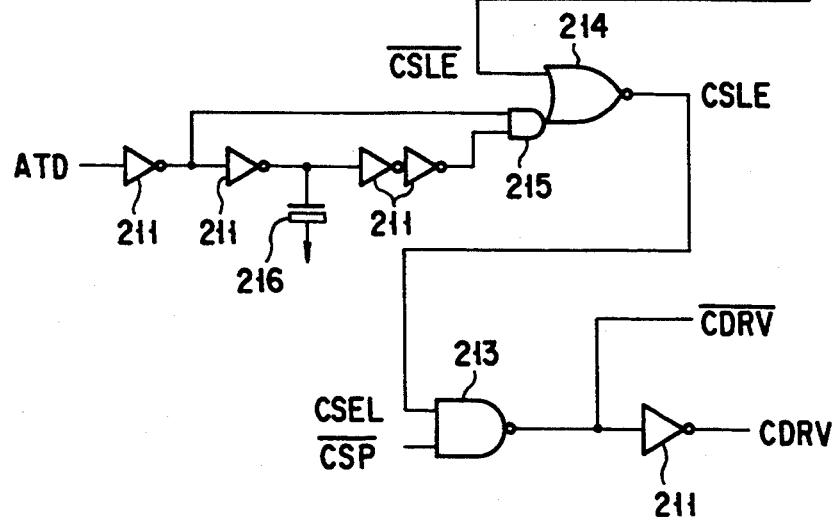
FIG. 21

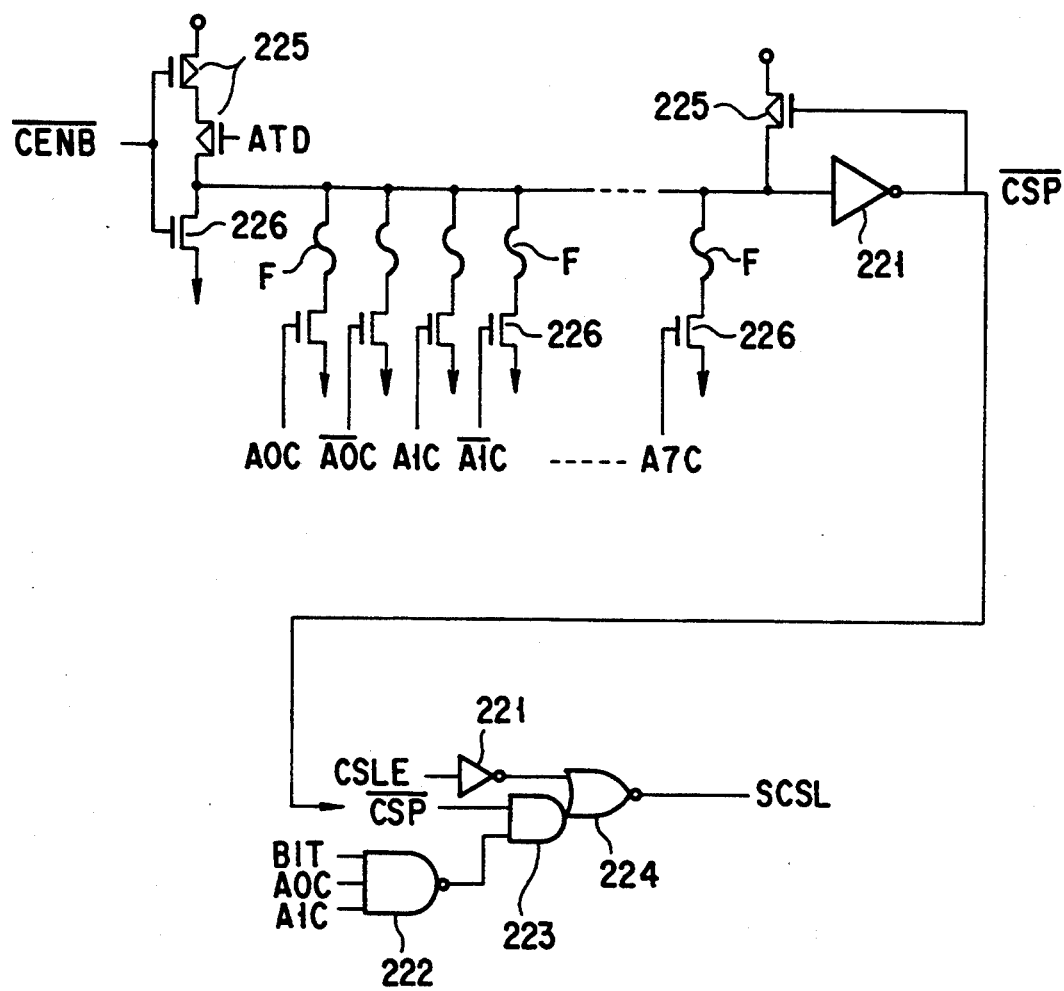
F I G. 22

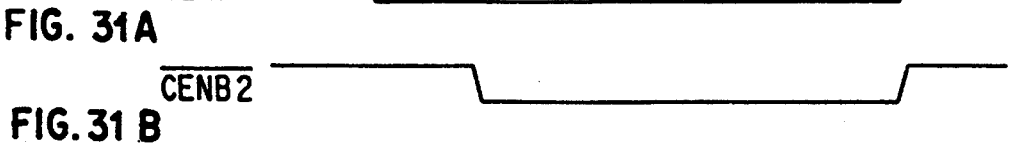
FIG. 31A $\overline{CENB1}$
FIG. 31B $\overline{CENB2}$
FIG. 31C CINT
FIG. 31D $\overline{WRT}$
FIG. 31E $\overline{WACP}$
FIG. 31F WTM
FIG. 31G $\overline{WDUR}$
FIG. 31H $\overline{WRST}$
FIG. 31I BIT
FIG. 32A $\overline{CENB1}$
FIG. 32B $\overline{CENB2}$
FIG. 32C CINT
FIG. 32D $\overline{WRT}$
FIG. 32E $\overline{WACP}$
FIG. 32F WTM
FIG. 32G $\overline{WDUR}$
FIG. 32H $\overline{WRST}$
FIG. 32I BIT

SEMICONDUCTOR MEMORY HAVING BUILT-IN VOLTAGE STRESS TEST MODE

BACKGROUND OF THE INVENTION

1. Field of the Invention

This invention relates to a semiconductor memory and, more particularly, it relates to a semiconductor memory provided with a built-in voltage stress test mode capable of testing the voltage stress applied thereto.

2. Description of the Related Art

Conventionally, a normal access mode is used for a voltage stress test such as a burn-in test utilizing an accelerating voltage or temperature to be conducted on a dynamic type semiconductor memory (DRAM) in the course of manufacturing. Such a test is time consuming when a screening operation is carried out to a satisfactory extent by utilizing an accelerating voltage. This is because, while the memory cell transfer gate shows the largest electric field strength in the internal circuit of a DRAM, the duty ratio of the electric field at the transfer gate is too small in a normal operation mode of the device.

There have been proposed a couple of time saving burn-in test techniques respectively called a DC (direct current) burn-in test mode and an AC (alternating current) burn-in test mode in an attempt to reduce the time required for a burn-in test.

The former technique consists in applying a high voltage simultaneously to a plurality of word lines of the memory cell array of a DRAM in order to increase the duty ratio of the electric field at the memory cell transfer gate.

The latter technique, on the other hand, consists in dividing the word lines of the memory cell array of a DRAM into two groups, a group with odd numbers and another with even numbers, selecting either of them and applying a high voltage to the word lines of the selected group. Thus, a high voltage is applied to every other word line of the device. This technique is advantageous in that the insulation between adjacent word lines and bit lines can also be checked during the screening.

In an alternative technique of utilizing an AC burn-in test mode, every forth word line is selected by utilizing the row address counter for CBR (CAS before RAS) automatic refreshing while the DRAM is held under an operating condition so that it may be used even if the device is sealed in a package.

However, while the above described techniques can raise the duty ratio of the electric field applied to the word lines of a DRAM, the duty ratio at the transistor for the column selection lines and the column selection gate (DQ gate) connected thereto remains low.

Additionally, although the circuits peripheral to the memory cells can be screened in a reading operation by using a conventional screening technique, they cannot be screened in a writing operation. Thus, such a conventional technique of utilizing a burn-in test mode cannot by any means really make it a time saving test mode for a DRAM.

It should be particularly noted that, when minute transistors are used, the rate of occurrence of a defective insulation film given rise to by foreign fine particles (malfunctioning A mode) becomes high if compared with the rate of occurrence of malfunctioning mode due to insulation film destruction caused by a relatively strong electric field (malfunctioning B mode), meaning that defective devices cannot be satisfactorily removed by screening only the word lines to which a strong electric field is applied.

The above described column selection gate, column decoder and circuits peripheral to them can show a malfunctioning A mode due to a defective insulation film to a relatively high proportion. Thus, all the circuits with a low duty ratio have to be improved to show a high duty ratio in order for a burn-in test mode to make time saving in the real meaning of the word.

Meanwhile, in the generation of 64 MDRAMs, the time required for a strong electric field to be applied to the transfer gate differs by an order of 10-4 from the time required for a strong electric field to be applied to the peripheral circuit transistor. Nevertheless, a same insulation film is commonly used for both the peripheral circuit transistor and the cell transfer gate transistor.

Therefore, in the generation of 64 MDRAMs, while the insulation film for the transfer gate and the one for the peripheral circuit transistor are subjected to an electric field with different field strengths, it is quite probable that a defective insulation film, if any, may pass a series of initial screening tests if it is used for the cell transfer gate.

Additionally, when there is a great difference between the above mentioned duty ratios, the peripheral circuit having a large duty ratio might have been worn away by the time when the last initially defective insulation film of cell transfer gate is removed in a screening test.

Finally, the more insulation film is made thin, the more A mode malfunction may become dominant. Therefore, there inevitably arises a need that the duty ratio be raised to a certain level for all the circuits of a DRAM so that all the circuits may be subjected to screening tests under equal conditions not simply for B mode malfunction of the cell transfer gate that can be damaged when a strong electric field is applied thereto.

As pointed out above, conventional semiconductor memories are accompanied by the problem that they are not subjected to screening tests under equal conditions by raising the duty ratios of all the memory circuits in a voltage stress test.

SUMMARY OF THE INVENTION

In view of the above identified problem, it is therefore an object of the present invention to provide a semiconductor memory provided with a time saving built-in test mode that can raise the duty ratios of all the memory circuits having a relatively low duty ratio for a voltage stress test and cause the peripheral circuits to operate in a manner same as they do for a normal course of operation including read/write operations, thereby realizing a real time saving test mode.

According to the invention, the above object is achieved by providing a semiconductor memory characterized in that it comprises a memory circuit including a memory cell array and peripheral circuits, a first means for selecting some of the word lines of the memory cell array, the first means being so adapted to select a greater number of word lines for a voltage stress test mode than for a normal operation mode, and a second means for selecting some of the column selection lines to thereby select the corresponding columns of the memory cell array, the second means being so adapted to select a greater number of column selection lines for a voltage stress test mode than for a normal operation mode.

With such an arrangement, the first means selects a greater than number of word lines for a voltage stress test mode than for a normal operation mode to consequently raise the duty ratios of the word lines. Likewise, the second means selects a greater number of column selection lines for a voltage stress test mode than for a normal operation mode to raise the duty ratios of the column selection lines.

Preferably, the sense amplifier contained in the device is inactivated during a write operation in a voltage stress test mode so that data may be simultaneously written in the selected large number of columns.

Since by far a longer time period is required for data to be simultaneously written in a large number of columns in a voltage stress test mode than in a normal operation mode, preferably the use of the write time-out feature, if any, of a DRAM that automatically and internally specifies a time period for data writing is prohibited in a voltage stress test mode and the write time is externally specified by means of an external signal (/WE: write enable signal).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 5 is a waveform timing chart for a normal operation of the circuits of FIGS. 2 through 4;

FIG. 6 is a waveform timing chart for a refreshing operation of the circuits of FIGS. 2 through 4;

FIG. 7 is a waveform timing chart for an operation of the embodiment of FIG. 1 in a time saving AC burn-in test mode;

FIG. 8A is a circuit diagram of the burn-in test mode signal generation circuit of FIG. 1 and FIG. 8B is a waveform timing chart for an operation in a burn-in test mode;

FIG. 12 is a waveform timing chart of the circuits of FIG. 11 in a normal operation mode when the fuses are not programmed or when, if programmed, an address other than that of the malfunctioning word line is input;

FIG. 15 is a waveform timing chart for an operation of the address buffer of FIG. 1 in a normal operation mode;

FIG. 16 is a waveform timing chart for an operation of the address buffer of FIG. 1 in a burn-in test mode;

FIG. 18 is a circuit diagram of the column decoder of FIG. 1;

FIG. 19 is a circuit diagram of a portion of the embodiment of FIG. 1 from the memory cell array to the column selection buffer;

FIG. 20 is a circuit diagram of a part of the sense amplifier and the bit line equalize and precharge circuit, illustrating how they are arranged for a column;

FIG. 21 is a circuit diagram of a CSL enabling circuit provided in the embodiment of FIG. 1;

FIG. 22 is a circuit diagram of a spare column drive circuit provided in the embodiment of FIG. 1;

FIG. 31 is a waveform timing chart for an operation of the circuit of FIG. 30 responsible for the write time-out feature in a normal operation mode; and FIG. 32 is a waveform timing chart for an operation of the circuit of FIG. 30 responsible for the write time-out feature in a burn-in test mode.

DETAILED DESCRIPTION OF THE PREFERRED EMBODIMENTS

Now, the present invention will be described in greater detail by referring to the accompanying drawings that illustrate a preferred embodiment of the invention.

Figure 1:
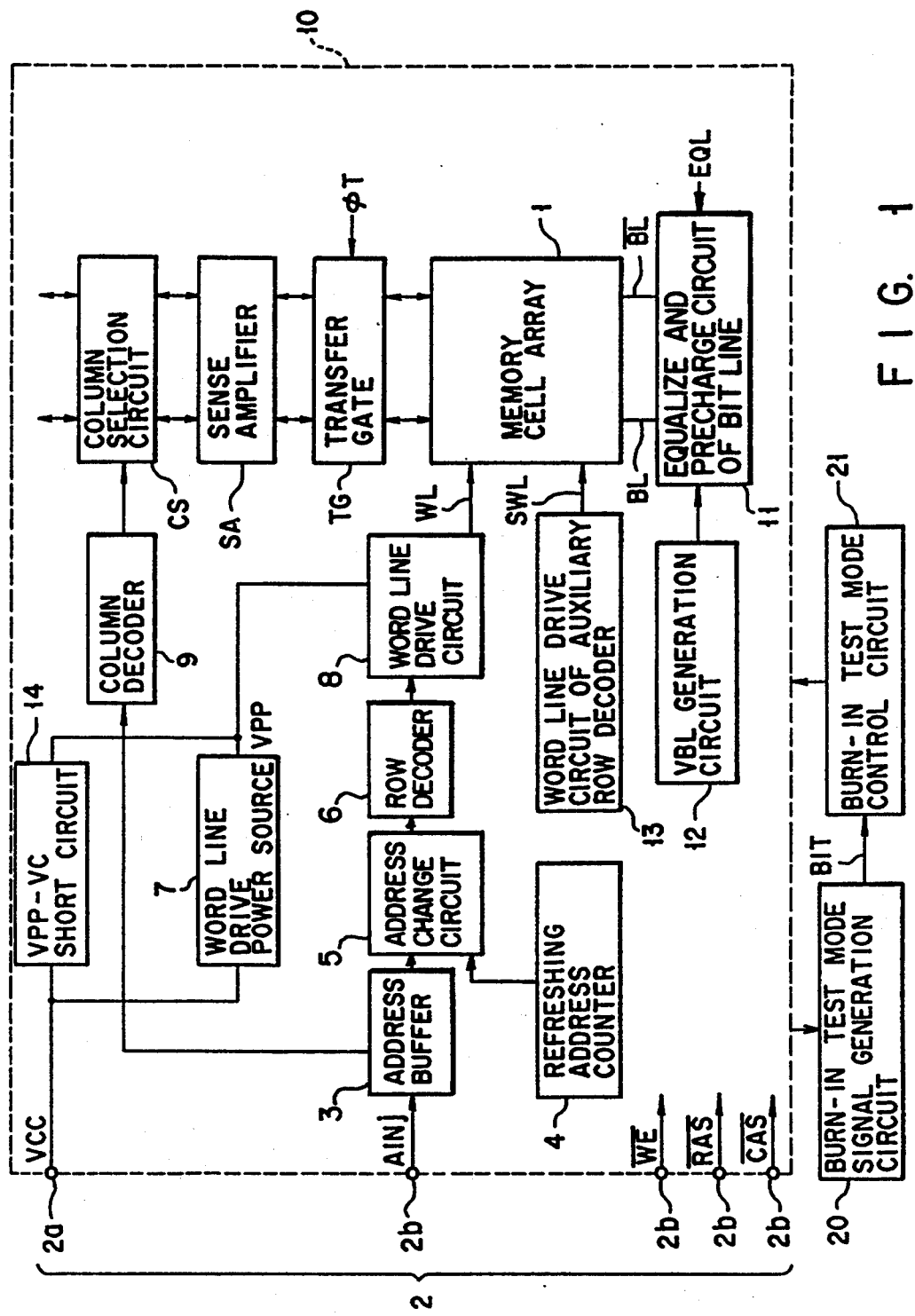
FIG. 1 is a block diagram of portions of a first embodiment of DRAM according to the invention relating to its row address buffer, said embodiment being provided with a built-in burn-in test mode feature.

FIG. 1 is a block diagram of portions of a first embodiment of DRAM according to the invention relating to its row address buffer, said embodiment being provided with a built in burn-in test mode feature.

Firstly, the overall configuration of the embodiment will be briefly described.

The embodiment of DRAM 10 is provided with a normal access mode, a normal burn-in mode, and a standardized plural bits parallel test mode as well as a time saving AC burn-in test mode for which an AC voltage stress is applied to a greater number of word lines than for a normal operation mode and a greater number of column selection lines are selected than for a normal operation mode.

When the DRAM still remains in the form of a wafer, the DRAM is entered into an AC burn-in test mode by applying a voltage to the pads on the wafer. When the DRAM is already sealed in a package, on the other hand, it is entered into an AC burn-in test mode in a specially arranged cycle. It is assumed hereinafter that the embodiment is entered into an AC burn-in test mode after it has been sealed in a package and hence in a specially arranged cycle.

Burn-in test mode signal generation circuit 20 is designed to generate a burn-in test mode signal BIT in response to a specifically defined signal entered by way of a part of external terminals 2 ... of the DRAM 10 which are used for normal operation. In this embodiment, signal BIT goes to a high level "H" when it is made active, whereas it goes to a low level "L" when it is made inactive.

Upon receiving a BIT from the signal generation circuit 20, burn-in test mode control circuit 21 holds only predetermined upper bits of a complementary output signal of address counter 4 of the DRAM 10 for refreshing to a same level in order to establish an AC stress test mode (e.g., a time saving burn-in test mode) where the duty ratios of the word lines WL where a high voltage is applied and the duty ratio of the selected column selection lines are higher than their counterparts in a normal operation mode.

Referring to FIG. 1, when the DRAM 10 generates a BIT in response to a specifically designed signal input through part of the external terminals 2 ... which are used for normal operation, predetermined upper bits of the output signal of the address counter 4 for refreshing are held to a same level to enter the device into a timing saving AC burn-in test mode.

Since the remaining lower bits of the output signal of the address counter 4 for refreshing change their respective levels depending on the operation of the counter, it is now possible to establish an AC stress test mode where the duty ratios of the word lines of the DRAM 10 where a high voltage is applied are higher than their counterparts in a normal operation modes and consequently screen the insulation films of the memory cell transfer gate for reduced pressure resistance.

Similarly, the duty ratios of the selected column selection lines can be raised along with the word lines by inputting the output signal of the address counter 4 for refreshing into the column address lines.

Now, the embodiment of FIG. 1 will be described still further.

In the DRAM 10 of FIG. 1, 1 denotes a memory cell array comprising one or more than one dynamic type memory cells are arranged to form a matrix and WL denotes a word line connected to the memory cells of a same row in said memory cell array 1, while BL and /BL denote a bit line pair connected to the memory cells of a same column in said memory cell array.

2 ... denote a number of external terminals including a power supply terminal 2a through which a power source voltage is applied and input terminals 2b. .. for receiving address signals /WE, /RAS (row address strobe signal) and /CAS (column address strobe signal).

3 denotes an address buffer circuit for amplifying external address signals coming in through part of the external terminals 2 ... and 4 denotes an address counter for refreshing that generates refreshing address signals for refreshing memory cells, while 5 denotes an address changeover circuit for selecting either an output signal of said address counter 4 or a row address signal of said address buffer circuit 3 and 6 denotes a row decoder circuit (word selection circuit) capable of selecting word lines in order to select an appropriate row in response to an internal row address signal coming from said address changeover circuit 5.

7 denotes a voltage source for driving word lines and 8 denotes a word line drive circuit comprising at least a word line drive MOS transistor (a PMOS transistor in this embodiment) connected between said word line drive voltage source 7 and said word lines WL for driving word lines in response to an output signal coming from said row decoder circuit 6.

SA denotes a sense amplifier for detecting data being read out into bit lines and 9 denotes a column decoder, while CS denotes a column selection circuit.

Additionally, a bit line transfer gate TG is arranged between the input node of the sense amplifier SA and the bit lines BL and controlled for ON/OFF by control signal T.

A bit line precharge and equalize circuit 11 is connected to said bit lines and controlled for ON/OFF by bit line equalize signal EQL. Said bit line precharge and equalize circuit 11 is supplied with a bit line precharge voltage VBL by a VBL generation circuit 12.

The embodiment additionally comprises redundant components (including spare memory cells, spare word lines SWL and a spare) that can be used in case the DRAM malfunctions.

Said word line drive voltage source 7 is a voltage step-up circuit for generating a word line drive voltage VPP by stepping up the externally applied power source voltage VCC on the semiconductor chip and then applying the word line drive voltage VPP to said word line drive circuit 8.

VPP-VCC short circuit 14 is designed to short circuit the output node of the word line drive voltage source 7 to the external power supply terminal 2a during a voltage stress test so that a word line drive voltage can be externally applied to the node during a voltage stress test.

The embodiment may be so designed that, in a WCBR cycle (where signal /WE and signal /CAS are made active before signal /RAS), for instance, said burn-in test mode signal generation circuit 20 reads in the row address signal input at the time when /RAS is made active, and, if the signal is a combination of predetermined addresses, it turns BIT to level "H".

If it is desired that a burn-in test mode has priority over and is compatible with a plural bit parallel test mode which is one of the known function test modes, a DRAM according to the invention may be so designed that it enters a plural bit parallel test mode when the power source voltage is in a normal operating condition (e.g., 3 V) whereas BIT goes to level "H" when the power source voltage shows a high value (e.g., 6 V) in a WCBR cycle.

It may be needless to say that, if the DRAM is provided only with a time saving AC burn-in test mode, a cumbersome procedure for the arrangement of compatible test modes becomes unnecessary. Thus, a DRAM according to the invention may be so designed that it enters into a time saving AC burn-in test mode only in a WCBR cycle. Alternatively, it may be so designed that a voltage which is much higher than a normal level (e.g., a supervoltage which is higher than the normal power source voltage) is specified for a given external terminal and it enters an AC burn-in test mode if such a high voltage is detected.

Now, the components of a DRAM according to the invention that are particularly important for the purpose of the present invention will be described in detail below by referring to FIGS. 2 through 32.

Figure 2:
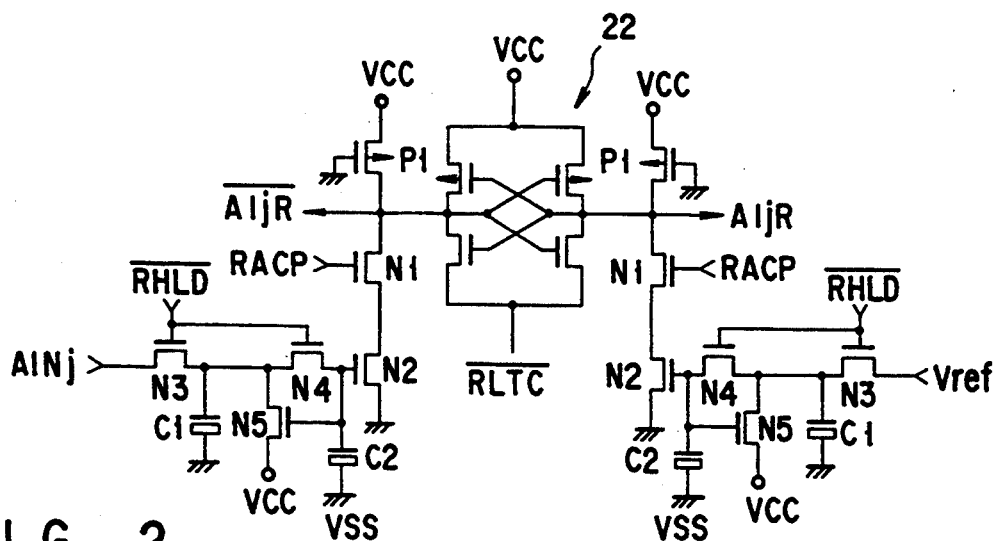
FIG. 2 is a circuit diagram of a part of the address buffer circuit of FIG. 1 to be used for row addresses.

FIG. 2 is a circuit diagram of a part of the address buffer circuit of FIG. 1 to be used for row addresses.

In FIG. 2, VCC is a power source voltage, VSS is the ground voltage, P1 is a P channel MOS transistor, N1 through N2 are N-channel MOS transistors, C1 and C2 are MOS capacitors whose VSS nodes are commonly connected to the drain/sources of the N channel MOS transistors, 22 is a differential type latch circuit, /RLTC is a latch control signal, AINj (j=0 through 10) is an external address signal, vref is a reference voltage, RACP and /RHLD are gate control signals and (AIjR, /AIjR) are complementary row address buffer output signals.

Figure 3:
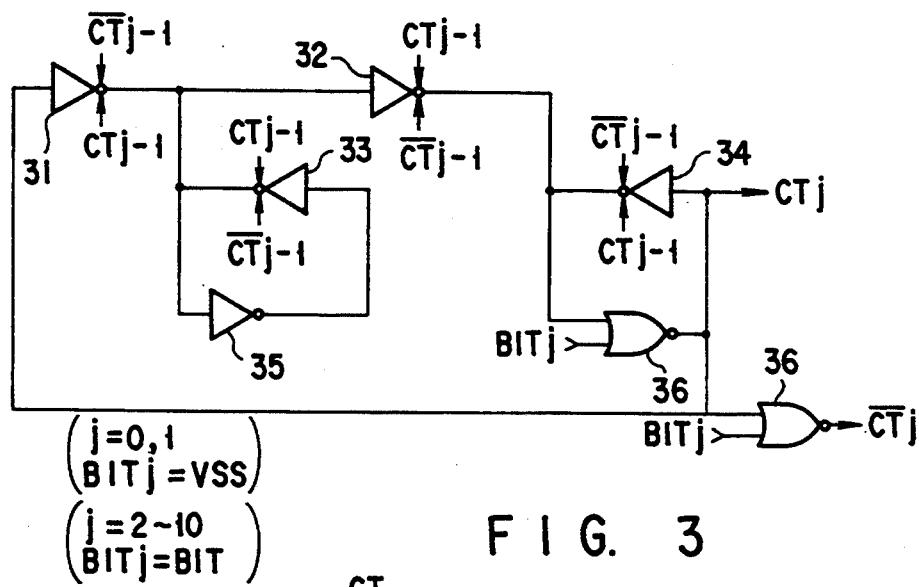
FIG. 3 is a detailed circuit diagram of a first section of the refreshing address counter and a part of the burn-in test mode control circuit of FIG. 1.

FIG. 3 is a detailed circuit diagram of a first section of the refreshing address counter 4 and a part (a block) of the burn-in test mode control circuit 21 of FIG. 1.

In FIG. 3, 31 through 34 are clocked inverters and 35 is an inverter. Each of the two-input NOR-gate 36 . . . shown in FIG. 3 is inserted in the complementary output terminals in each block of the address counter and BITj (j=0 through 10) are input into one of the input terminals of each of the NOR-gates 36 . . . BITj is at level "H" when the memory device is entered into a burn-in test mode whereas it is at level "L" when the memory is in a normal operation mode. (CTj, /CTj) (j=0 through 10) are complementary output signals of the address counter.

It should be noted here that if a shared sense amplifier method with which the sense amplifier SA is used by adjacent memory cell blocks on a time-sharing basis is not employed, BIT is input as BITj into one of the input terminals of each of the NOR-gates 36 . . . inserted into the output terminals, for instance, for the upper 9 bits (j=2 through 10 bit) of the output of the address counter.

On the other hand, voltage vSS (level "L") is input as BITj into one of the input terminals of each of the NOR-gate 36 . . . inserted into the output terminals for the remaining lower 9 bits (j=0, 1 bit). In other words, the NOR gates 36 . . . are used as so many inverters.

Figure 4:
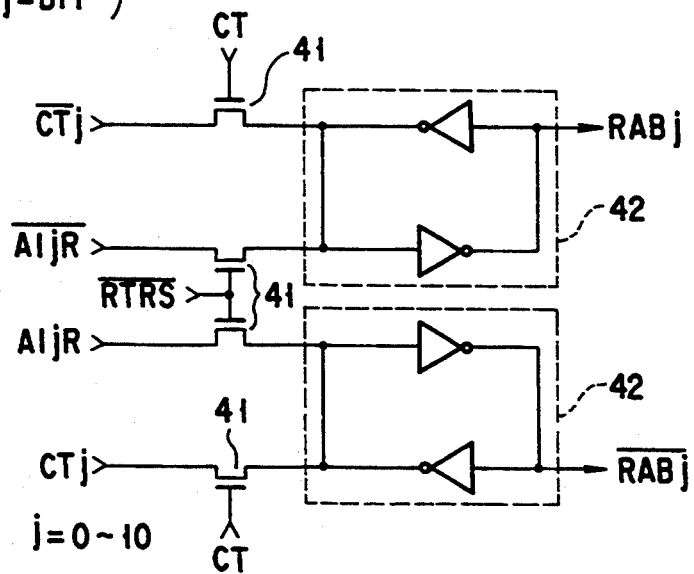
FIG. 4 is a circuit diagram of a part of the address changeover circuit.

FIG. 4 is a circuit diagram of a part (a unit) of the address changeover circuit.

In FIG. 4, 41 . . . are address changeover NMOS transistors, 42 . . . are inverters for a latch circuit, /RTRS is an address changeover signal for selecting an output of the row address buffer, CT is a changeover signal for selecting an output of the address counter and (AjR, /AjR) are selected outputs (internal row address signals).

The circuits of FIGS. 2 through 4 are logically so configured that they operate with the waveform timing charts of FIG. 5 through 7 respectively for a normal read/write operation, a refresh operation (CBR operation) and a time saving AC burn-in test mode.

FIG. 5 is a waveform timing chart for a normal operation.

For a normal operation of the embodiment, BIT is at level "L" and the DRAM circuit 10 operates exactly as a conventional DRAM. More specifically, during the course of a normal operation where it takes in a row address signal by means of an activated /RAS signal and then a column address signal by means of an activated /CAS signal, CT is held to level "L" and signal /RTRS is held to level "H" whereas NMOS transistors 41 . . . are turned on. Consequently, it select row address output signals (AIjR, /AIjR) and takes them in as internal row address signals (AjR, /AjR) to select specified word lines.

FIG. 6 is a waveform timing chart for an automatic refreshing operation in a CBR cycle (where signal /CAS is activated before signal /RAS).

During the course of an automatic refreshing operation, signal /RTRS is immediately turned to level "L" and row address buffer output signals (AIjR, /AIjR) are not selected. At the same time, signal CT is activated and the output signals stored in the address counter 4 at that moment are selected and taken in as internal row address signal (AjR, /AjR) so that the memory cells selected by the word line selection signals available at this time are automatically refreshed (without requiring any external address input operations).

FIG. 7 is a waveform timing chart for an operation in a time saving AC burn-in test mode.

In an AC burn-in test mode, BIT is turned to level "H" the upper 9 bits of the output signals (CTj, /CTj) of the refreshing address counter 4 for (j=2 through 10) are held to level "1" whereas the lower 2 bits of the output signals (CTJ, /CTj) of the address counter 4 change their levels in response to the operation of the counter.

If a CBR cycle is carried out under this condition, the upper 9 bits (j=2 through 10) of the internal row address signals (AjR, /AjR) are held to level "H", whereas the lower 2 bits (j=0, 1) of the internal row address signals (AjR, /AjR) change their levels in response to the operation of the counter.

Consequently, the word line drive circuit 8 is only partly selected and only the selected word lines WL are turned to level "H".

FIG. 8A is a circuit diagram of a burn-in test mode signal generation circuit that can be used for the embodiment of FIG. 1.

In FIG. 8A, WCBR is a signal generated when a clock is input for a WCBR cycle, /AOR and A1R are part of the internal row address signals that are activated by signal /RAS and ROR is a signal generated when a clock is input for a ROR cycle (RAS only refresh cycle where only signal /RAS is temporarily activated). 61 is a three-input NAND gate, 62 is a flip-flop circuit and 63 is an inverter.

The circuit of FIG. 8A is logically so configured as to operate with the waveform timing chart of FIG. 8B. BIT rises up if a WCBR cycle is carried out while bits AOR, A1R of the address signals are at level "L". After the AC burn-in test mode is over, BIT falls to level "L" by carrying out an ROR cycle.

Figure 9:
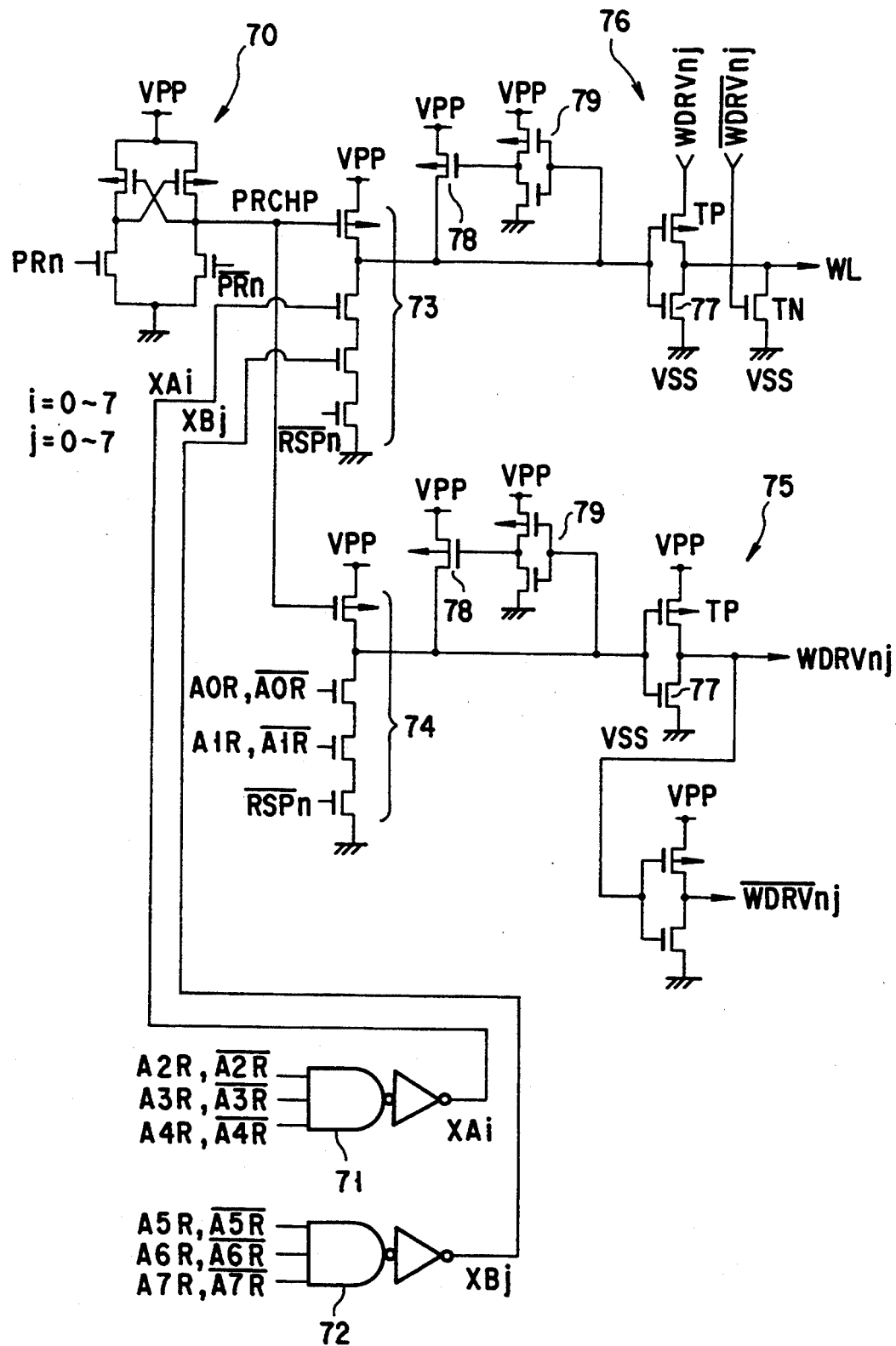
FIG. 9 is a circuit diagram of the row decoder circuit, a part of the word line drive circuit and a predecoding circuit that can be used in the embodiment of FIG. 1.

FIG. 9 is a circuit diagram of the row decoder circuit, a part of the word line drive circuit and a predecoding circuit that can be used in the embodiment of FIG. 1.

Figure 10:
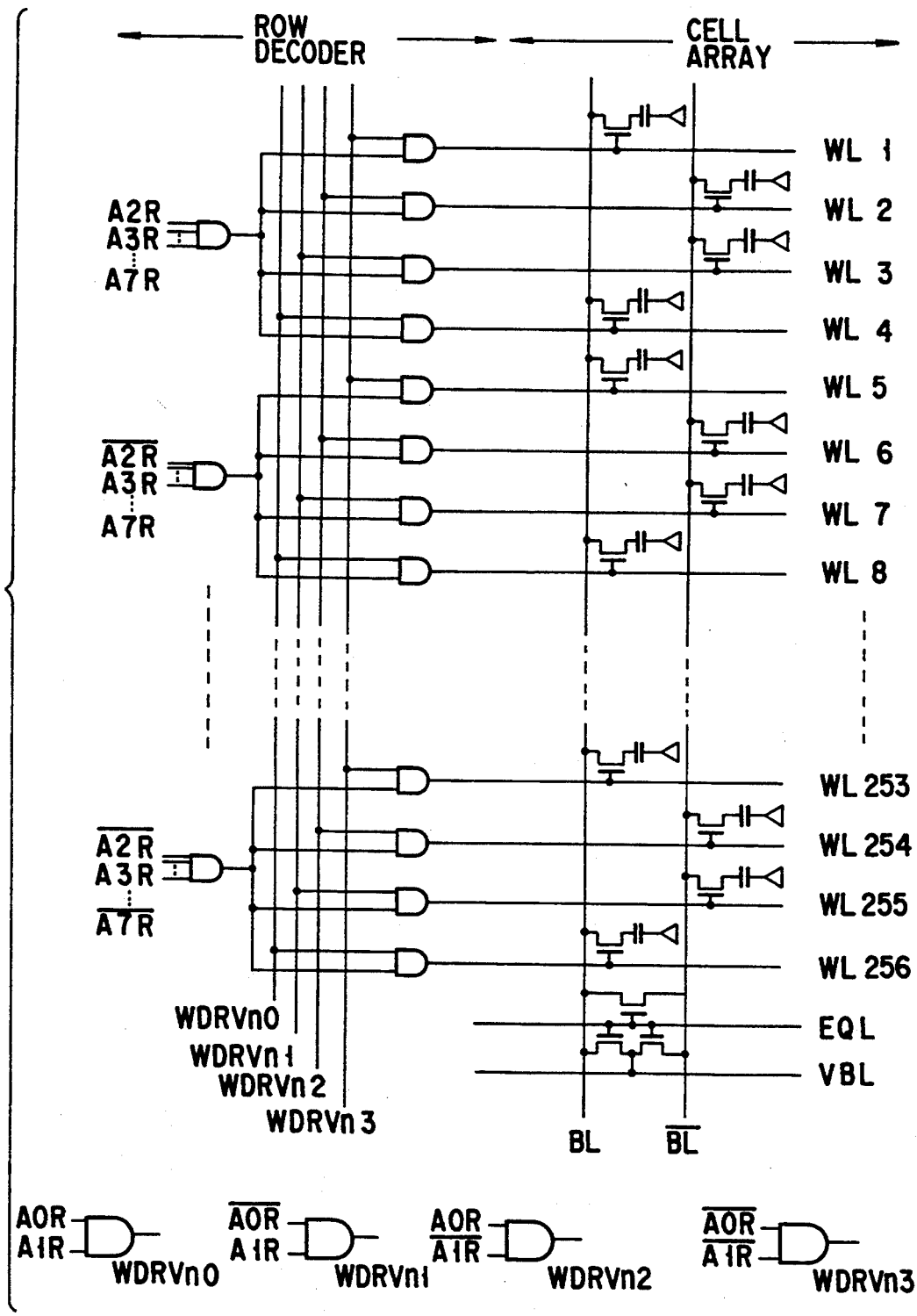
FIG. 10 is a circuit diagram of a block of the memory cell array and the row decoder corresponding to the block.

FIG. 10 is a circuit diagram of a block of the memory cell array and the row decoder corresponding to the block. Referring to FIGS. 9 and 10, precharge signals PRn, /PRn are input into a differential circuit 70 for memory cell block n to output a precharge signal PRCHP.

NAND-circuit 71 decodes internal row address signals A2R, /A2R, A34, /A3R, A4R and /A4R and outputs signals XAi (i=0 through 7).

NAND-circuit 72 decodes internal row address signals A5R, /A5R, A6R, /A6R, A7R and /A7R and outputs signals XBj (j=0 through 7).

NAND circuit 73 comprises PMOS transistors to be used for a precharge load which is input to the gate by signal PRCHP and decode signals XAi, XBj and /RSPn.

NAND-circuit 74 comprises PMOS transistors to be used for a precharge load which is input to the gate by signal PRCHP and decodes internal address signals (AOR, /AOR), (A1R, /A1R) and signal /RSPn. Thus, a total of four such circuits are arranged for a memory cell block in this embodiment.

A first word line drive circuit 75 is selectively driven by the output of said NAND-gate (row decoder) 74 whereas a second word line drive circuit 76 is selectively driven by the output of said NAND-gate (row decoder) 73.

Said first word line drive circuit 75 comprises a word line drive PMOS transistor TP connected between a drive voltage source node and a voltage DRVnj, an NMOS transistor 77 connected between a word line and a VSS node, a pull-up PMOS transistor 78 connected between a VCC node and a drive circuit input node and an inverter 79 connected said drive circuit input node and the gate of said pull up PMOS transistor 78.

Voltage VDRVnj has an end connected to the output nodes of said first word line drive circuit 75 (there being a total of four such nodes in this embodiment) and the other end connected to a group of drive voltage source nodes of the second word line drive circuit 76. /WDRVnj is a voltage inversive to said voltage WDRVnj.

On the other hand, said second word line drive circuit 76 comprises a word line drive PMOS transistor TP connected between a drive voltage source node and a word line WL, an NMOS transistor 77 connected between said word line and a VSS node, a pull-up PMOS transistor 78 connected between a vCC node and a drive circuit input node, an inverter connected between said drive circuit input node and the gate of said pull-up PMOS transistor 78 and a noise killer NMOS transistor TN connected to an end of said word line, said voltage /WDRVnj being input to the gate of said transistor TN.

Each of word lines WL . . . has an end connected to a corresponding one of a group of output nodes of the second word line drive circuits 76.

Figure 11:
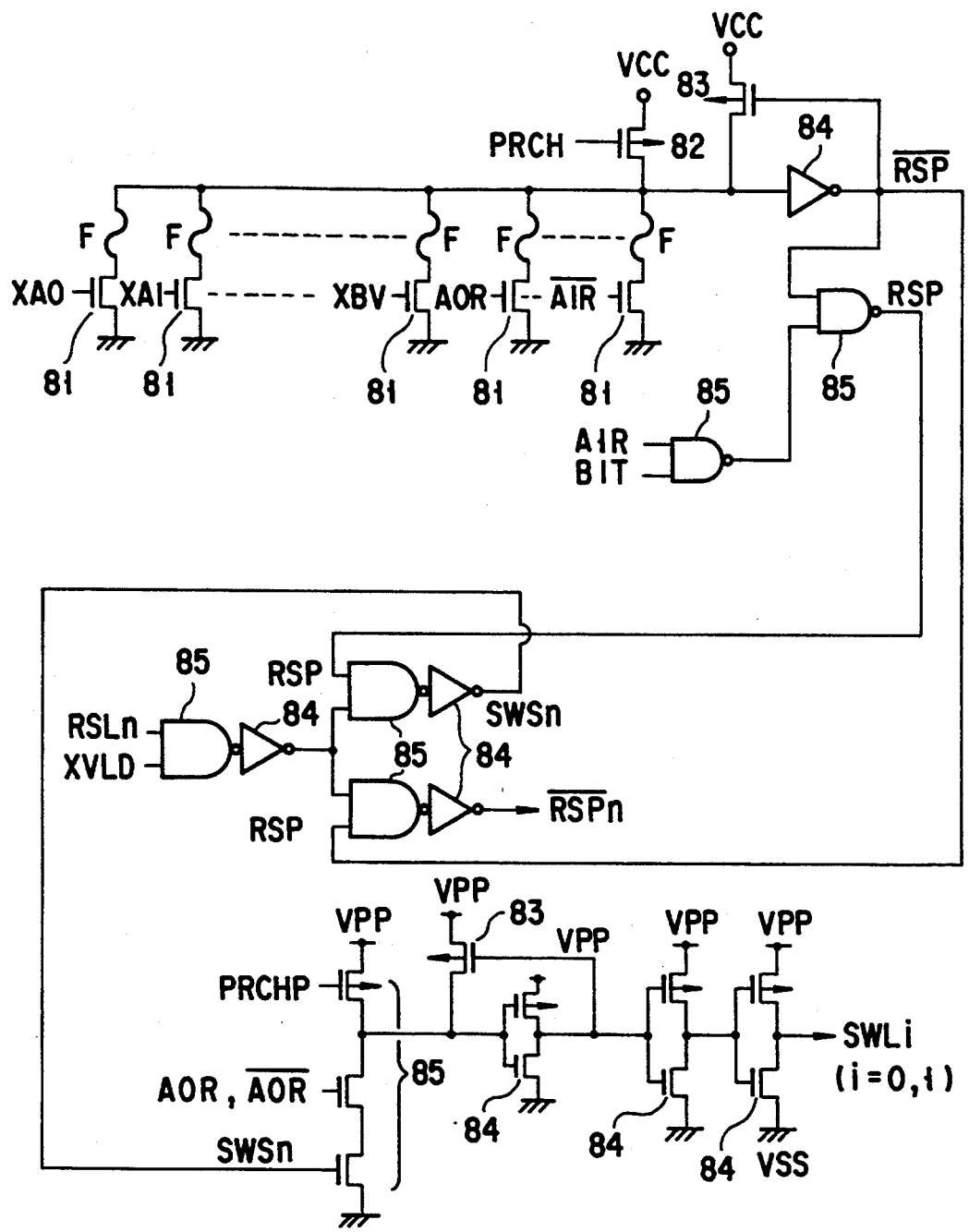
FIG. 11 is a circuit diagram of the spare row decoder and word line drive circuit FIG. 1.
Figure 13A:
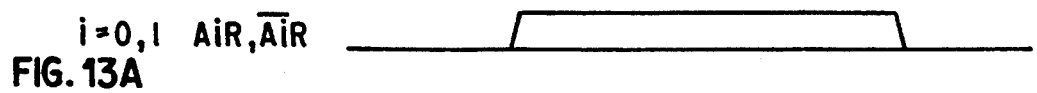
FIG. 13 is a waveform timing chart of the circuits of FIG. 11 in a burn-in test mode when the fuses are not programmed or when, if programmed, an address other than that of the malfunctioning word line is input.
Figure 13B:
Figure 13C:
Figure 13D:
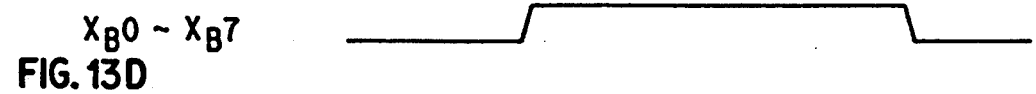
Figure 13E:
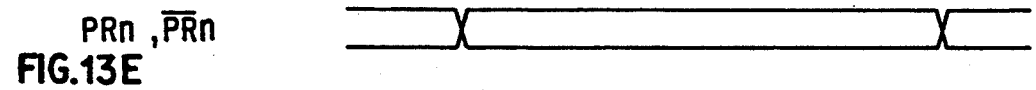
Figure 13F:
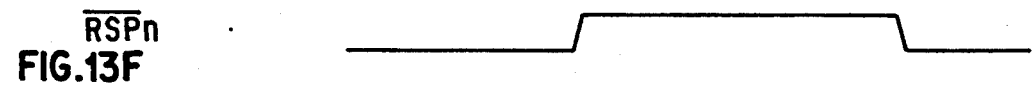
Figure 13G:
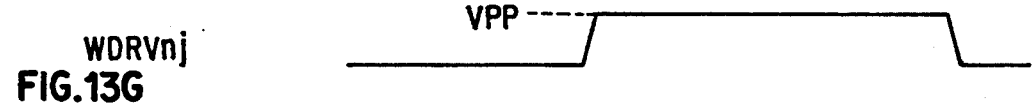
Figure 13H:
Figure 13I:
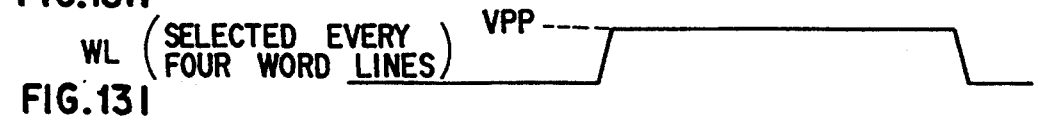

FIG. 11 is a circuit diagram of the spare row decoder and word line drive circuit FIG. 1.

When one or more than one malfunctioning word lines come into being among the proper word lines, execution of a program is triggered as a corresponding fuse is molten to make the malfunctioning word lines inoperative and a spare word line is selected for use in place of a malfunctioning word line whenever the latter is addressed.

In FIG. 11, 81 . . . are NMOS transistors whose gates are used to receive an address signal to be decoded for a NOR-gate and whose sources are grounded, while their drains are connected together by way of respective fuse elements F . . . that are typically made of polysilicon. The fuse elements F . . . are selectively cut as a function of the address to be decoded. 82 is a precharge PMOS transistor, 83 . . . are pull-up PMOS transistors, 84 . . . are inverters, 85 . . . are NAND-gates and Vpp is a high voltage generated within the chip for the word lines.

The circuits of FIG. 9 through 11 are so configured that they logically operate with the waveform timing charts of FIG. 12 or 13.

FIG. 12 shows a waveform timing chart that is applicable for an operation in a normal operation mode when the fuses of FIG. 11 are not programmed or when, if programmed, word lines that are not malfunctioning are addressed.

On the other hand, FIG. 13 shows a waveform timing chart that is applicable for an operation is a burn-in test mode when the fuses of FIG. 11 are not programmed or when, if programmed, word lines that are not malfunctioning are addressed.

If signal BIT is at level "L", a single word line WL is selected in activated n memory cell blocks in the memory cell array regardless of normal operation or automatic refreshing operation.

If, on the other hand, signal BIT turns to level "H" and complementary signals (AjR, /AjR) of the internal row address signals turns to level "H" except the lower 2 bits (j=0, 1), signals XAi and XBj goes to level "H" and signal /RSPn (a signal to raise a spare word line) rises up, when the output of the NAND circuit 71 goes to level "L".

Consequently, all the gate potentials of the word drive PMOS transistors TP to whose sources respective word line voltages WDRVnj are applied fall to a same "L" level.

Under this condition, the four voltage wires WDRVnj are selectively turned to level "H" on a one by one basis as a function of the state of address bits AOR, A1R (which reciprocate between a low level and a high level) selected by an output signal of the refresh counter 4 in a CBR cycle.

Every fourth word line is selected from the word lines WL of a block by the word line drive circuit 76 connected to the selected voltage wire to make the total number of simultaneously selected word lines equal to sixty-four (64) within a block. Therefore, if all of the n memory cell blocks are simultaneously subjected to a word line selecting operation, every fourth word line is made to rise in all the blocks.

Thus, a greater number of word lines WL rise up in this cycle than in an ordinary operation cycle to give electric field stress to word lines efficiently. What is more, since every fourth word line is selected, a strong electric field can by applied to neighboring word lines WL so that all the word lines WL may be screened for a malfunctioning mode more effectively than in a case where they are subjected to voltage stress for a DC burn-in test. If such a CBR cycle is repeated for four times, all the word lines will be tested for rising since every fourth word line is selected in a CBR cycle.

If, on the other hand, only those address signals that are sent to the gate of the transistors each of which is connected to a broken fuse element F for NOR input in a normal operation (where signal BIT is held to level "L"), signal /RSP goes to level "L" while signal RSP goes to level "H". When synchronizing signal XVLD of the block selected by a block selection signal RSLn rises from level "L" to level "H", signal /RSP is held to level "L" and signal SWSn rises from level "L" to level "H" so that therefore spare word lines SWLi (i=0, 1) are selected depending on the logic level of address signal A0R or /A0R.

If a NOR input address signal rises to level "H" while any of the fuse elements F . . . is not broken or an address signal sent to the gate of a transistor 81 for NOR input other than those connected to a broken fuse element F, then signal /RSP rises to level "H" and signal RSP falls to level "L" so that signal /RSPn rises along with signal XVLD to select word lines as illustrated in FIG. 12.

With such operations, if signal BIT is at level "L", spare word line SWLi and word line WL cannot be selected simultaneously.

However, if signal BIT goes to level "H" in an AC burn-in test mode, both signals /RSP and RSP go to level "H" when address bit A1R is at level "H".

Thus, as signal SVLD rises, signals SWSn and /RSPn rise up simultaneously so that spare word line SWLi and word line WL are decoded only by address bits A0R and A1R to rise. Consequently, spare word line SWLi and word line WL are subjected to AC stress with a same duty ratio.

Referring to FIG. 11, while a normal word line and a spare word line do not simultaneously rise in a normal operation mode, it becomes necessary in a burn-in test mode to raise both word lines (with an exactly same duty ratio) for screening. In order to meet this requirement, generation of signal RSP is controlled for raising a spare word line by means of an output of a NAND circuit for A1R and BIT.

With such an arrangement, if BIT goes to level "H", the spare word line rises only when A1R is at level "H". Since there are two spare word lines SWL0 and SWL1 that come into the scene and are decoded by A0R, each of them rises once in every four cycles.

Figure 14:
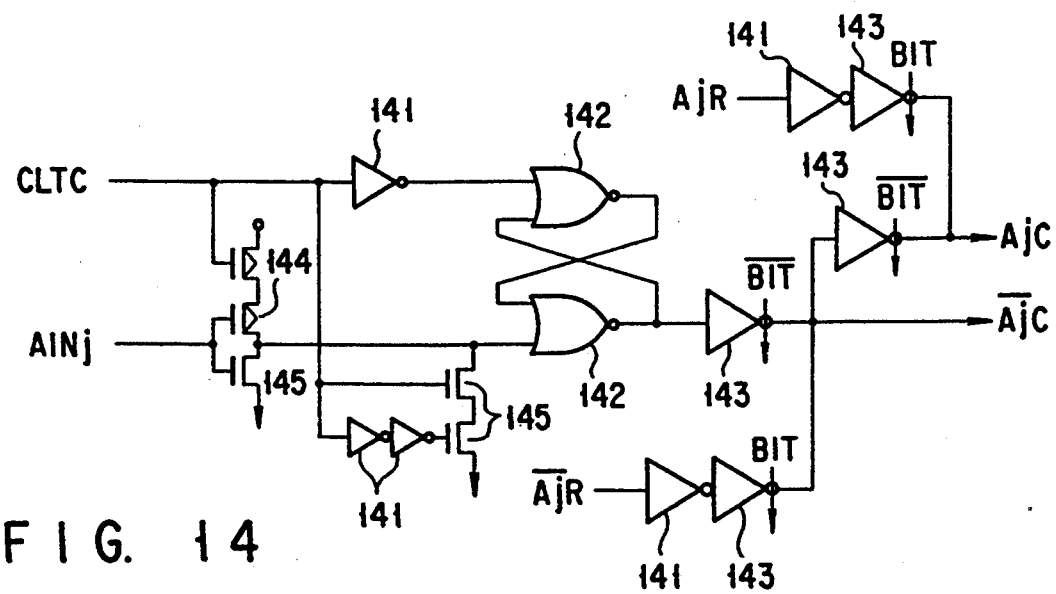
FIG. 14 is a circuit diagram of a part of the address buffer circuit to be used for column addresses.

FIG. 14 is a circuit diagram of a part of the address buffer circuit to be used for column addresses.

In FIG. 14, 141 . . . are CMOS inverters, 142 . . . are CMOS two-input NOR gates, 143 . . . are CMOS clocked inverters, 144 . . . are PMOS transistors, 145 . . . are NMOS transistors, CLTC is a signal to be used to latch a column address, /BIT is an inverted signal of BIT and (AjC, /AjC) are internal column address signals.

The above column address buffer operates to take in external addresses AINj as internal column addresses (AjC, /AjC) in a normal operation mode (BIT="L") as illustrated in FIG. 15, whereas it operates to take in row addresses (AjR, /AjR) specified by the output of the refreshing address counter as internal column addresses (AjC, /AjC) without modifying them as illustrated in FIG. 16.

Figure 17:
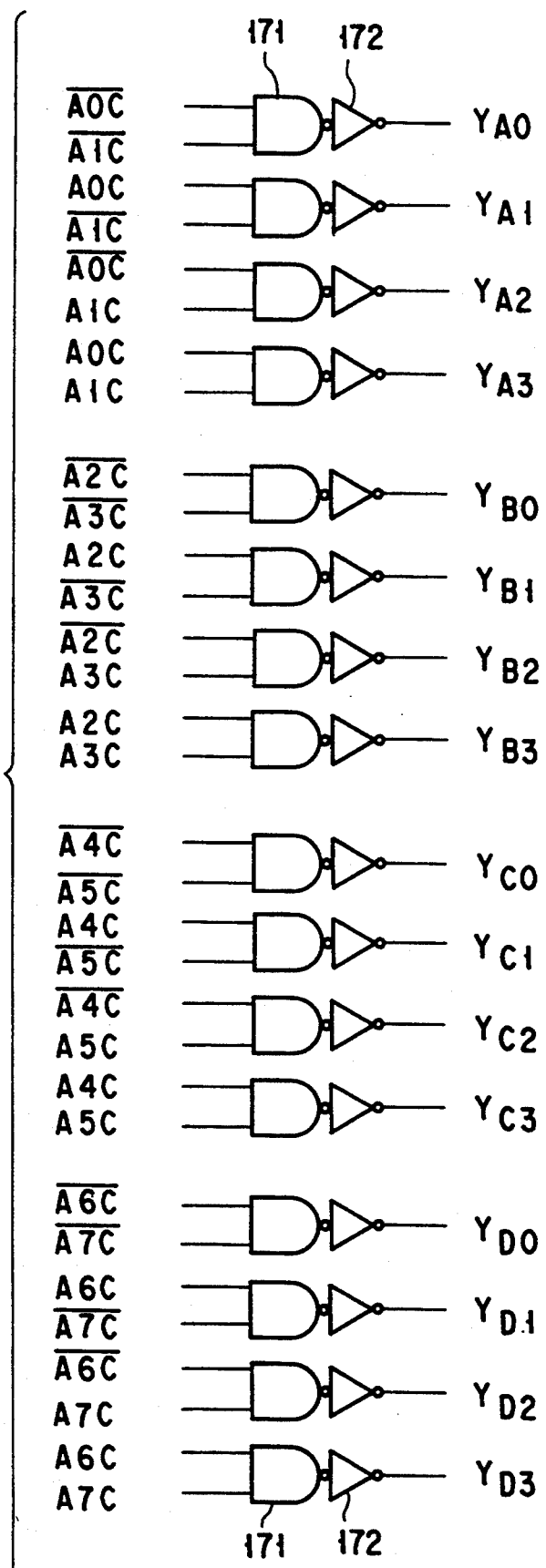
FIG. 17 is a circuit diagram of a predecoding circuit that can be used for column addresses in the embodiment of the FIG. 1.

FIG. 17 is a circuit diagram of a predecoding circuit to be used for column addresses.

This circuit is logically so configured that it decodes column addresses A0C, /A0C through A7C, /A7C to output signals YA0 through YA3, YB0 through YB3, YC0 through YC3 and YD0 through YD3.

In FIG. 17, 171 . . . are CMOS two-input NAND-gates and 172 . . . are CMOS inverters.

FIG. 18 is a circuit diagram of the column decoder of FIG. 1.

This circuit is logically so configured that it decode signals YA0 through YA3, YB0 through YB3, YC0 through YC3 and YD0 through YD3 from the predecoding circuit of FIG. 17 and outputs selection signals for two hundred fifty six (256) column selection lines CSL1 through CSL256.

In FIG. 18, 181 . . . are four input NAND-gates, 182 . . . are CMOS inverters, 183 . . . are PMOS transistors and 184 . . . are NMOS transistors.

FIG. 19 is a circuit diagram of a portion of the embodiment of FIG. 1 from the memory cell array to the column selection buffer (DQ buffer).

FIG. 20 is a circuit diagram of a part of the sense amplifier and the bit line equalize and precharge circuit, illustrating how they are arranged for a column of FIG. 19.

In FIGS. 19 and 20, 191 is a row decoder/word line driver, MC . . . are memory cells, WLi (i=1 through 256) are word lines, BLi, /BLi (i=1 through 1024) are bit line pairs, 192 . . . are bit line precharge and equalize circuits, VBL is a bit line precharge voltage, EQL is an equalize signal, 193 . . . are sense amplifiers (S/A), SAP, /SAN are sense amplifier enable signals, 194 is a sense amplifier driver, 195 . . . are column selection gates, DQi, /DQi (i=1 through 4) are data line pairs, 196 . . . are DQ buffers and CSLi (i=1 through 256) are two hundred fifty six (256) column selection lines.

The circuits of FIGS. 17 through 20 are logically so configured that they operates in a manner as described below.

In a normal operation mode, one of YA0 through YA3, one of YB0 through YB3, one of YC0 through YB3 and one of YD0 through YD3 go to level "H" as column addresses are predecoded and only one of two hundred fifty six (256) four-input NAND-gates 181 . . . in the column decoder outputs level "L" to drive a selected CSLi, which is turned to level "H".

As the selected column selection line CSLi is turned to level "H" in a read operation, complementary data of a pair of bit lines BL, /BL that are amplified by S/A194 are read out to the outside as they are connected to the paired DQ, /DQ by way of a column selection gate 195.

Conversely, in a write operation, data from the paired DQ, /DQ reverse the state of S/A194 via the column selection gate 195 and written in bit line pair BL, /BL. In this embodiment, four DQ, /DQ pairs and four bit line pairs (or four columns) are connected simultaneously.

It should be noted that, in the circuit of FIG. 20 and particularly in a write operation, the data of S/A194 that have been latched in a given direction need to be forcibly latched back in the opposition direction via the column selection gate 195. This means that the circuit (not shown) to be used to drive the paired DQ, /DQ needs to have a certain degree of magnitude and the transistors of the column selection gates 195 cannot latch back the latched data of S/A194 if it is too small. On the other hand, the drive circuit for the paired DQ, /DQ in a write operation is required to reverse the data of only one S/A194 and therefore is not required to be excessively large.

FIG. 21 is a circuit diagram of a CSL enabling circuit provided in the embodiment of FIG. 1.

In FIG. 21, 211 . . . are CMOS inverters, 212 is a four-input NAND gate, 212 . . . are two-input NAND-gates, 214 is a two-input NOR-gate, 215 is a two-input AND-gate and 216 . . . are MOS capacitors realized by short-circuiting the respective drains and sources of so many NMOS transistors.

FIG. 22 is a circuit diagram of a spare column drive circuit provided in the embodiment of FIG. 1.

In FIG. 22, 221.. are inverters, 222 is a three-input NAND gate, 223 is a two-input NAND-gate, 224 is a two-input NOR-gate, 225 ... are PMOS transistors, 226 ... are NMOS transistors and F ... are fuse elements.

The above spare column drive circuit is logically so designed that, as in the case of the spare word lines described earlier, it prohibits access to a malfunctioning column and selects a spare column if an address is given to access the malfunctioning column.

Now, the operation of column selection line CSL will be described for two occasions by referring to FIGS. 23 through 28. One is when the circuits of FIGS. 21 and 22 are in a normal operation mode and the other is when they are in a burn-in test mode.

Figure 23:
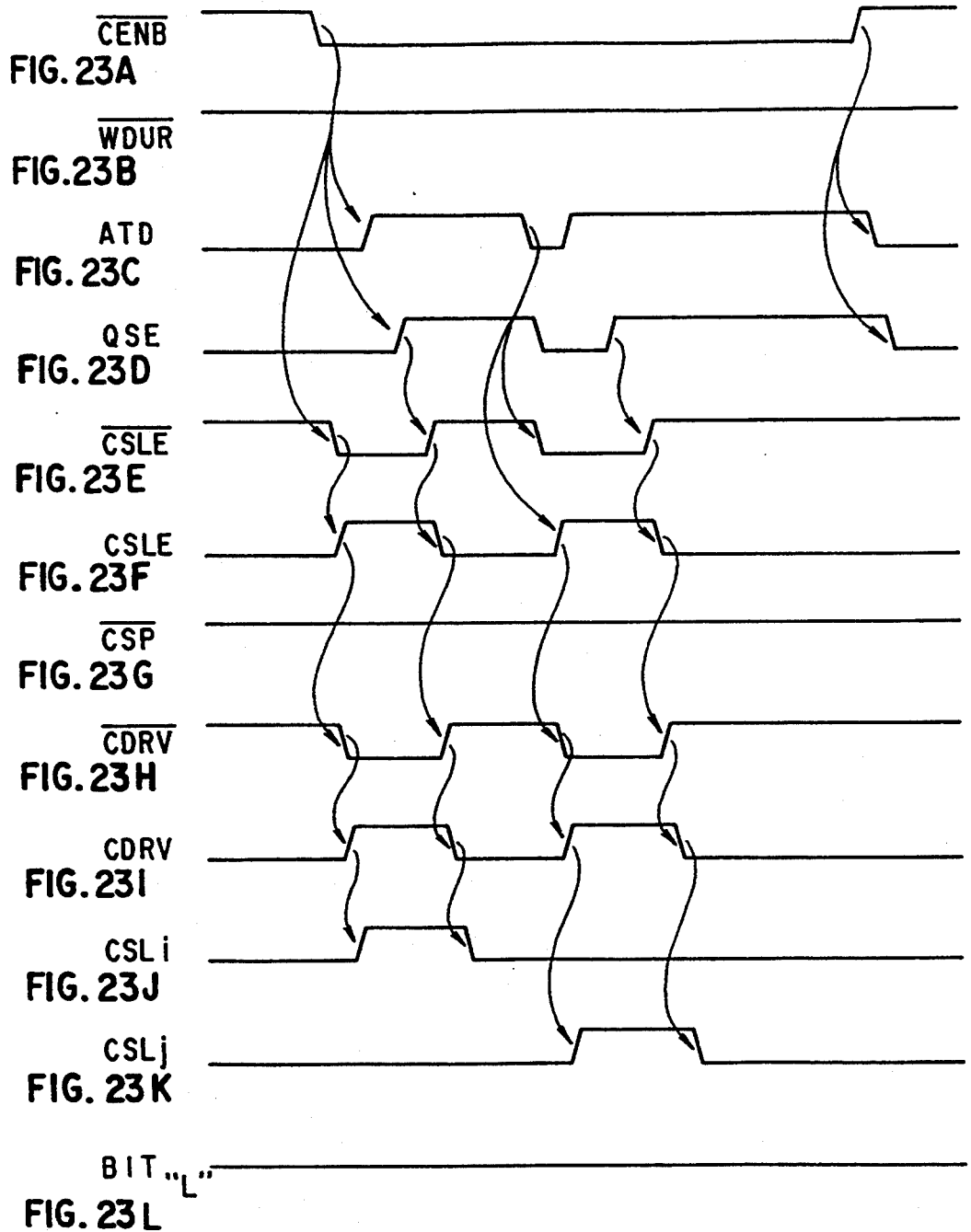
FIG. 23 is a waveform timing chart for a read operation of the circuits of FIGS. 19 through 22 in a normal operation when a normal CSL is selected.
Figure 24:
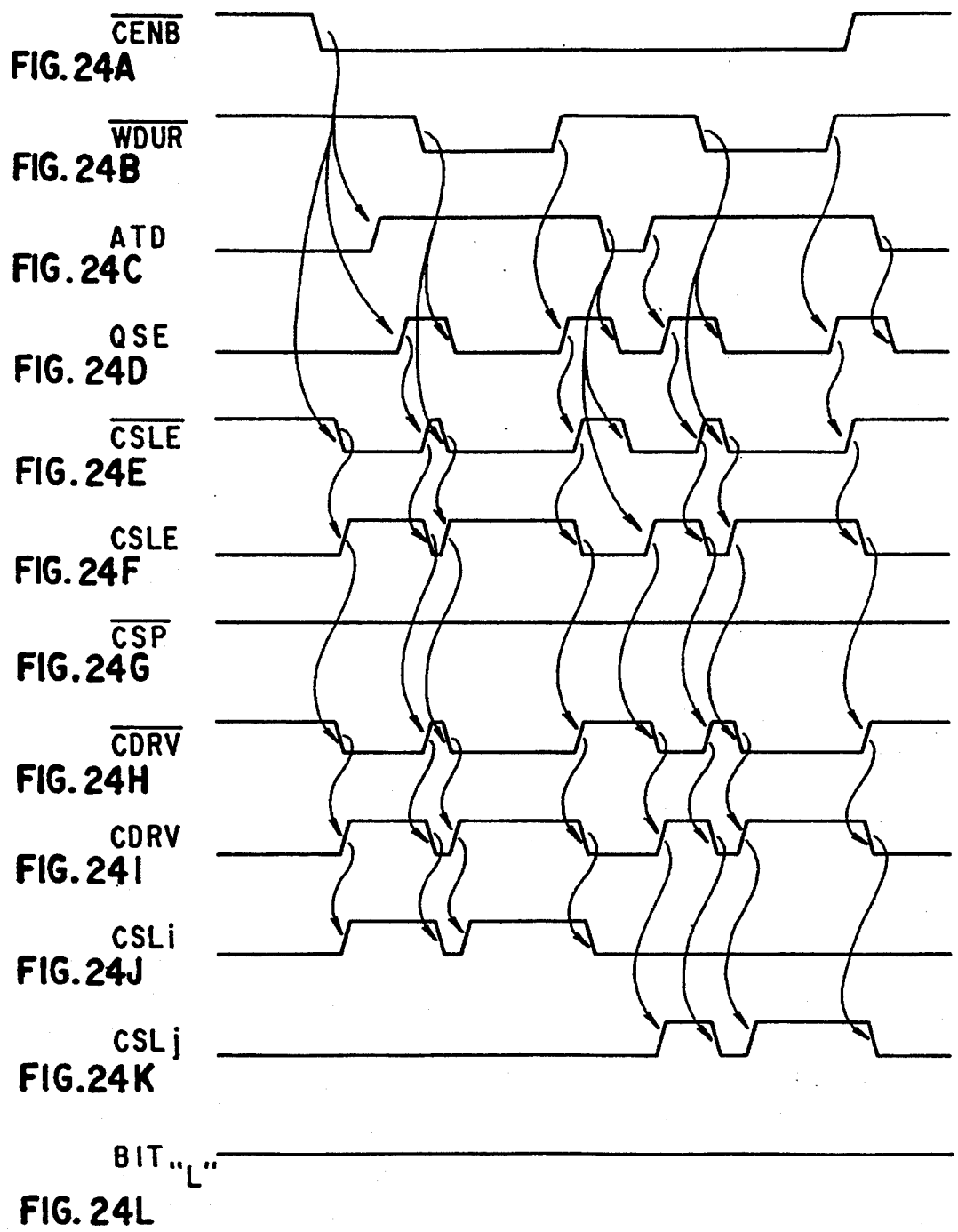
FIG. 24 is a waveform timing chart for a write operation of the circuits of FIGS. 19 through 22 in a normal operation when a normal CSL is selected.

FIGS. 23 and 24 respectively illustrate waveform timing charts for read and write operations of the circuits of FIGS. 21 and 22 in a normal operation mode when a normal CSL is selected.

Figure 25:
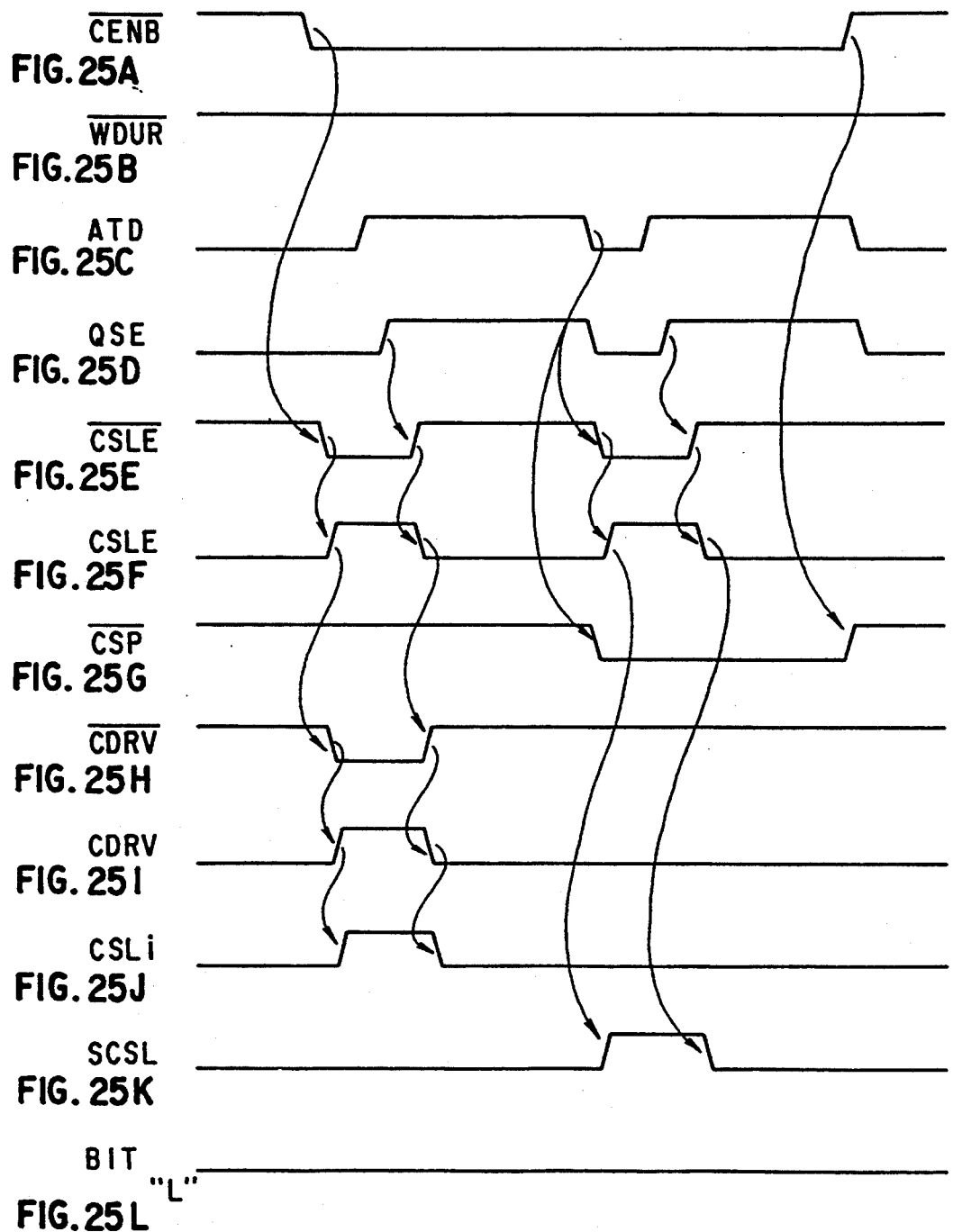
FIG. 25 is a waveform timing chart for a read operation of the circuits of FIGS. 19 through 22 in a normal operation when a spare CSL is selected.
Figure 26:
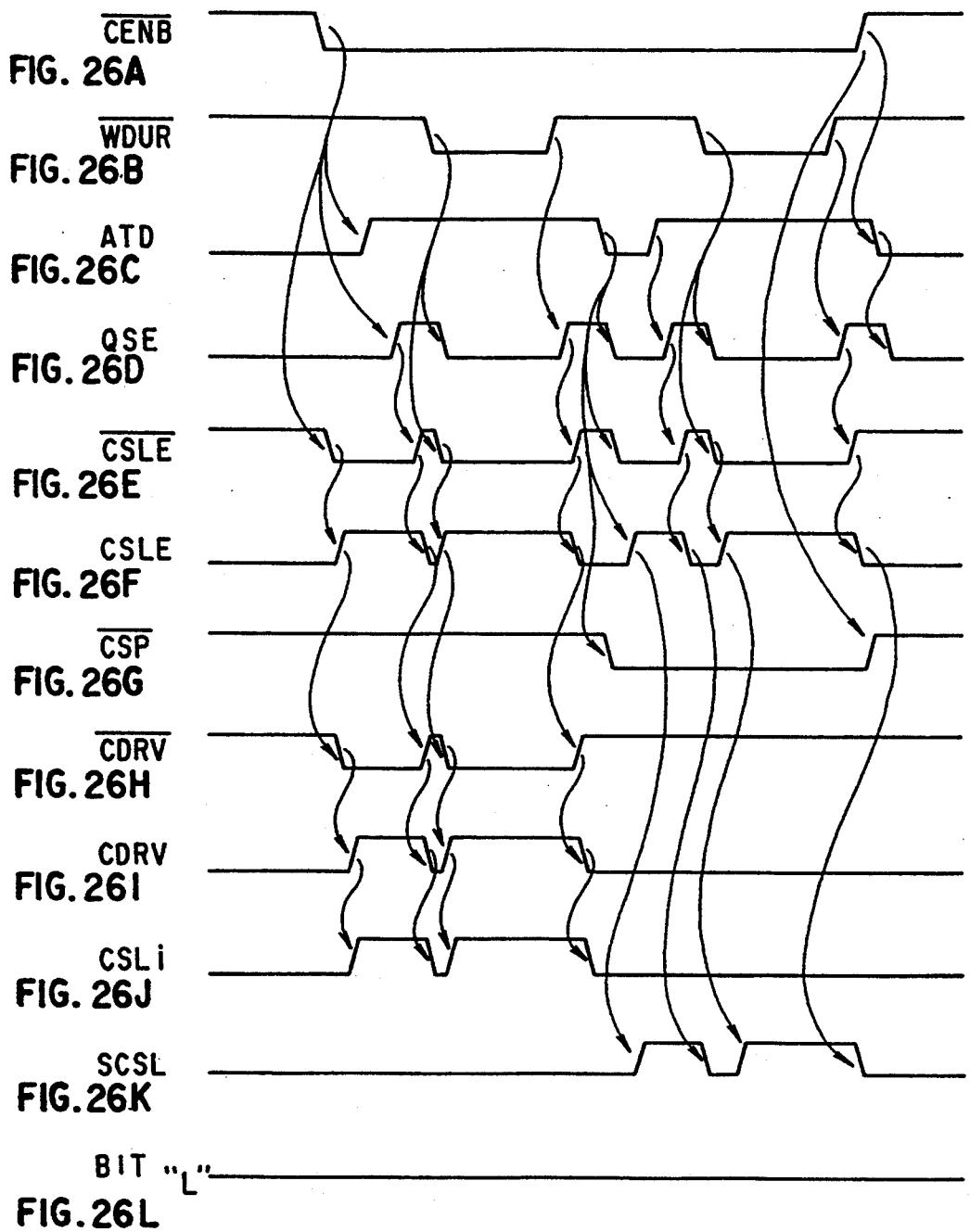
FIG. 26 is a waveform timing chart for a write operation of the circuits of FIGS. 19 through 22 in a normal operation when a spare CSL is selected.

FIGS. 25 and 26 respectively illustrate waveform timing charts for read and write operations of the circuits of FIGS. 21 and 22 in a normal operation mode when a spare CSL (SCSL) is selected.

Figure 27:
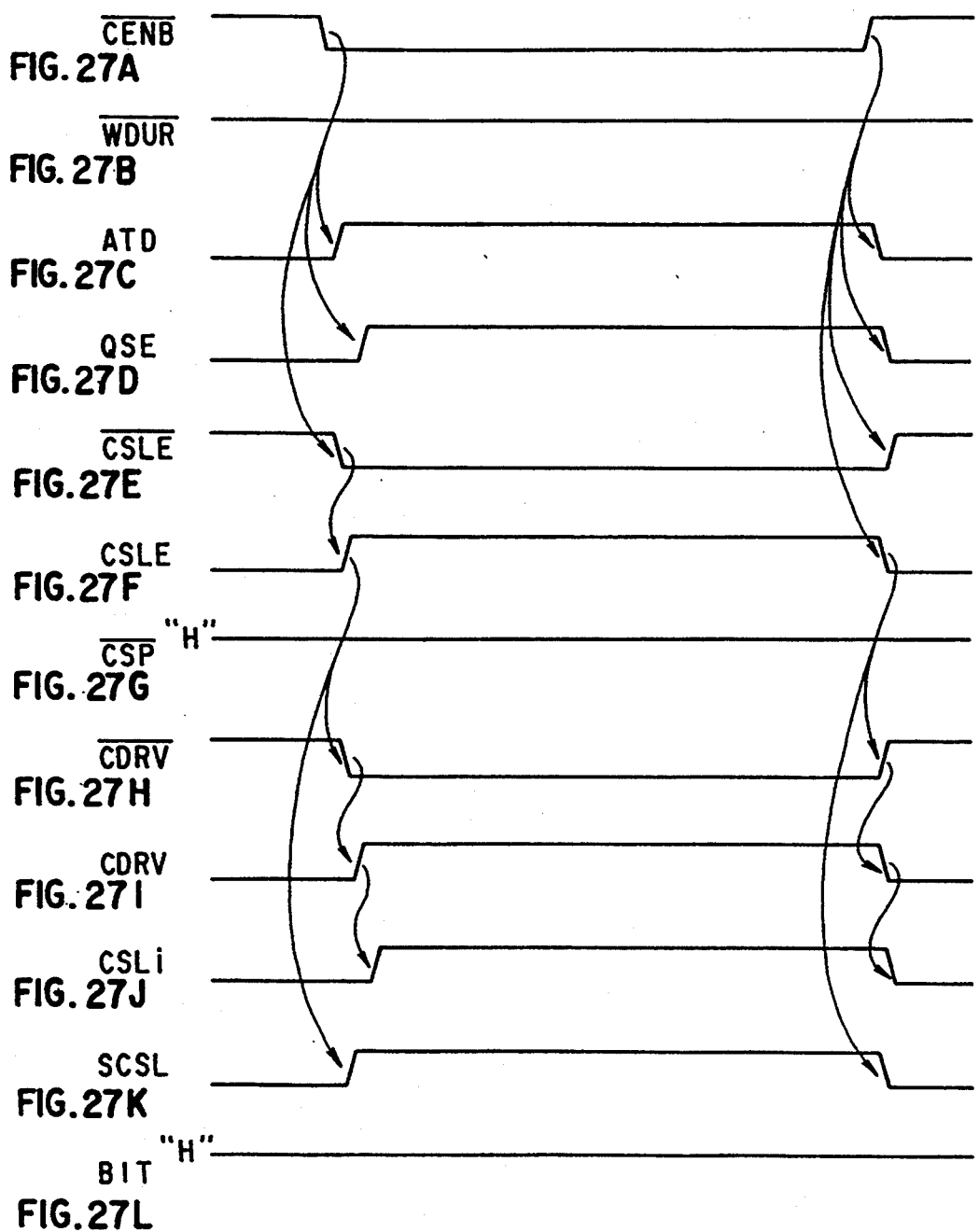
FIG. 27 is a waveform timing chart for a read operation of the circuits of FIGS. 19 through 22 in a burn-in test mode.
Figure 28:
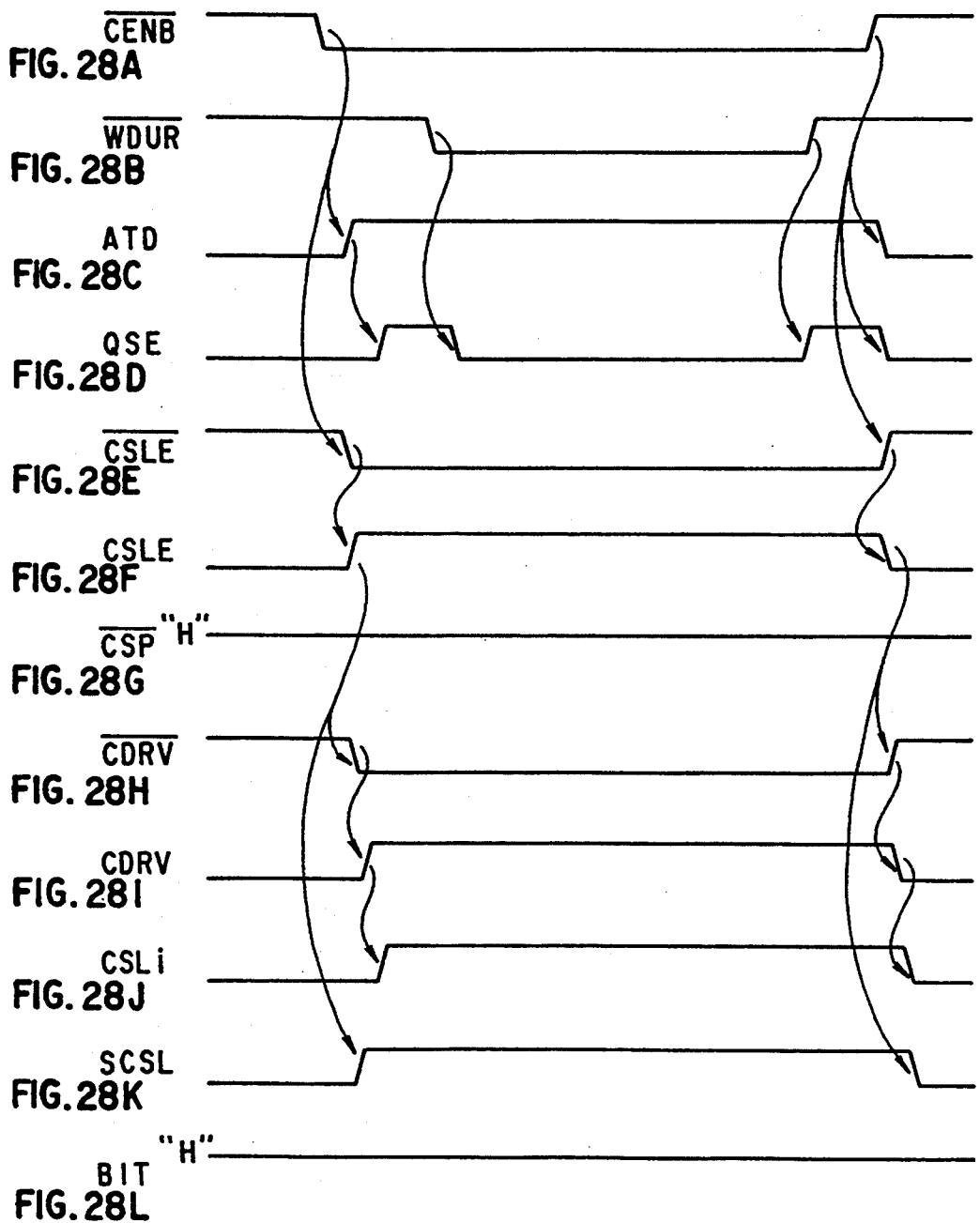
FIG. 28 is a waveform timing chart for a write operation of the circuits of FIGS. 19 through 22 in a burn-in test mode.

FIGS. 27 and 28 respectively illustrate waveform timing charts for read and write operations of the circuits of FIGS. 21 and 22 in a burn-in test mode. (1) Read operation in a normal operation mode when a normal CSL is selected As illustrated in FIG. 23, S/A is activated by making the corresponding word line go up to a high level in order to amplify data on a bit line pair and make column enable signal /CENH go down to a low level. Then, column selection enable signal CSEL rises to raise a CSLi selected by the current column address. Consequently, the signal which is amplified on the bit line pair via a column selection gate comes to a DQ line pair so that it is amplified in the second stage by the DQ buffer, using subsequently selected QSE, and output as data.

Thereafter, current address is changed and address transition detect signal ATD is issued to raise another CSLi in order to carry out another sequence of operation. Note that CSEL is pulse driven and therefore a CSLi rises in the form of pulse for a period of time necessary for a sense amplifier of the DQ buffer and then falls to 0V. (2) Write operation in a normal operation mode when a normal CSL is selected.

While this operation is basically similar to the write operation illustrated in FIG. 23, QSE is made to remain at a low level during a write period (where /WDUR is at a low level) in order to inactivate the DQ buffer whereas CSEL is made to go up to a high level in order to select a CSLi as illustrated in FIG. 24.

In a write operation again, the address is changed once in the course of a cycle as in the case of read operation of FIG. 23. The selected CSLi rises twice, once for "read" and once for "write", for each of the addresses. (3) Read operation in a normal operation mode when an SCSL is selected.

As in the case of FIG. 23 where a normal CSL is selected in a normal operation mode for a read operation, the address is changed once in the course of a cycle as illustrated in FIG. 25. In this example, a normal CSL is selected for the first address and an SCSL is selected for the second address.

Referring to the CSP generation circuit of FIG. 22, if the address of a malfunctioning column is (AOC, A1C, ..., A7C) = (0, 1 ..., 1), it will be so programmed that the address of the malfunctioning column is decoded as the corresponding fuse F is broken by melting.

FIG. 25 illustrates an example where the address given in the second input is faulty. Then, /CSP falls to a low level while the SCSL rises to a high level. (4) Write operation in a normal operation mode when an SCSL is selected.

While, this operation is basically similar to the write operation illustrated in FIG. 25, when a faulty address is input as the second address, the SCSL rises twice, once for "read" and once for "write". (5) Read operation in a burn-in test mode.

As shown in FIG. 27, BIT goes high whereas CSEL goes low as soon as /CENB goes low. Consequently, the pulse drive operation of CSL is prohibited so that the DQ gate is subjected to stress for a prolonged period of time.

Referring to FIG. 22 again, since all the column addresses AiC, AiC are held to a high level except i=0, 1, /CSP is constantly held to a high level regardless if the corresponding fuse F is programmed.

Thus, CDRV is able to rise up to select a normal CSL under any circumstances. Since all the column addresses are deprived of the addressing ability except AOC, A1C, every fourth CSL is selected so that a total of 64 CSLs are selected simultaneously.

Additionally, since BIT is high even if /CSP is high, the SCSL rises in synchronism with CSLE when both AOC and A1C are high. As the counter is operated in a CBR cycle, the SCSL is raised once in every four CBR cycles to select a duty ratio same as that of a normal CSL so that consequently a high screening effect may be achieved. (6) write operation in a burn-in test mode.

As seen in FIG. 28, both CSLi and SCSL operate in a manner as they do in a read operation illustrated in FIG. 27. Since the duration of a write operation (during which WDUR remains low) can be specified by an external signal (/WE) to any desired period of time without using the "write time-out" feature, stress may be applied thereto for a sufficient period of time, which may at the same time allow a write operation to be carried out simultaneously on a large number of columns.

Figure 29:
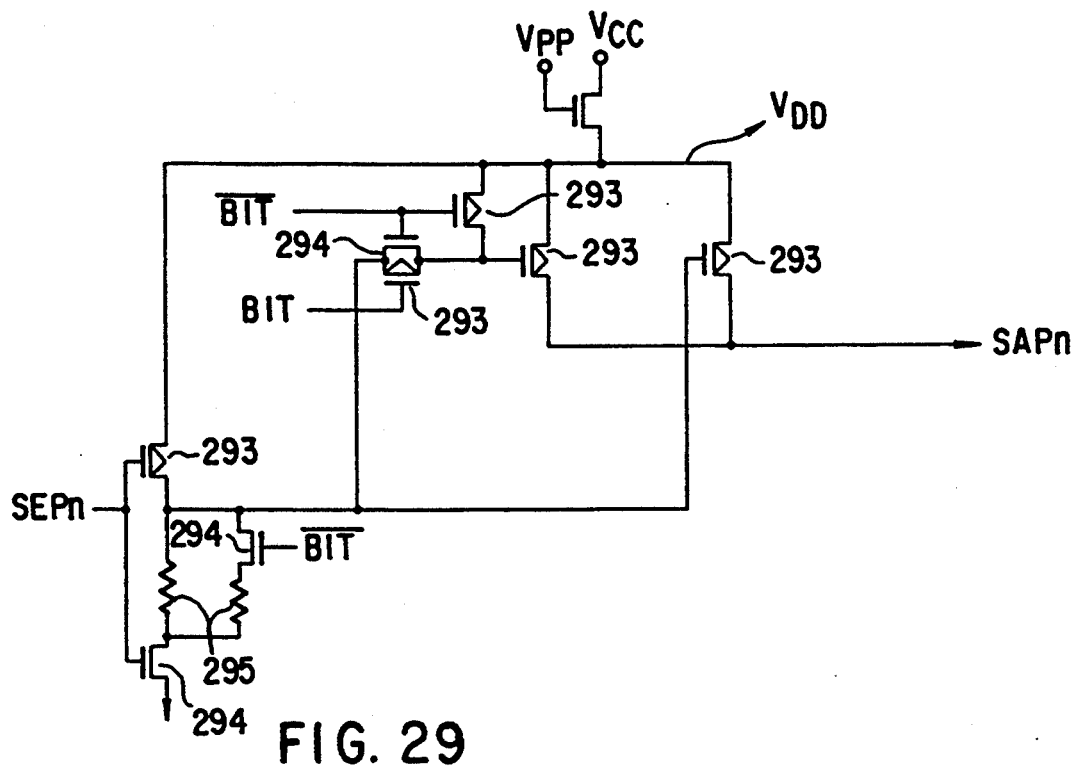
FIG. 29 is a circuit diagram of a sense amplifier driver provided in the embodiment of FIG. 1.
Figure 29A:
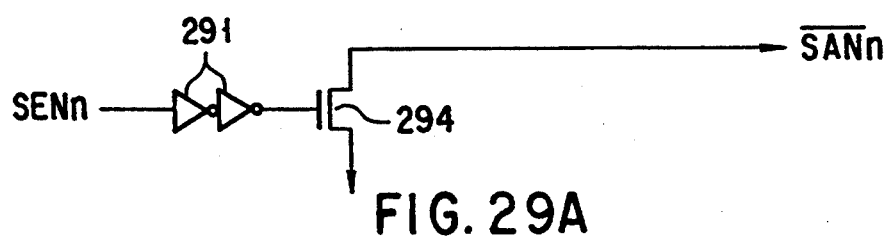
Figure 29B:
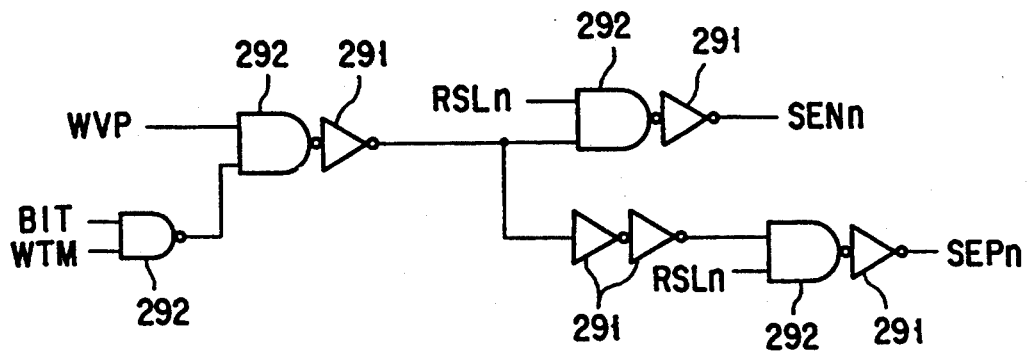

FIG. 29 is a circuit diagram of the sense amplifier driver in FIG. 19.

In FIG. 29, 291 ... are inverters, 292 ... are two-input NAND-gates, 293 ... are PMOS transistors, 294 ... are NMOS transistors and 295 ... are resistors. SENn, SEPn are sense amplifier enable signals for the selected block n and SAP, /SANn are sense amplifier drive signals, whereas WUP is a signal that goes high once a word line has completely risen up and WTM is a signal that goes high during a write operation. RSLn is a signal to select the n-th cell array. The n-th cell array is selected when the signal is at a high level.

The sense amplifier driver is logically so configured as to operate in a manner described below.

In a normal operation mode where BIT is low, SENn of the selected block rises to draw off the electric charge of the low level side bit line via /SANn once a cell signal appears on a bit line pair. Thereafter, SEPn of the selected block rises to electrically charge the high level side bit line via SAPn. Consequently any minute signals that may appear on the bit line pair will be amplified.

On the other hand, in a burn-in test mode where BIT rises high, while a read operation proceeds in a way same as it does in a normal operation mode because WTM is at a low level when the read operation started, SENn=SEPn="L" becomes true for a write operation as WTM goes high during the write operation so that all /SANn, SAPn come into a floating state. Consequently, signals amplified by S/A for latching are not latched any more and hence inverted data may be externally written in.

Thus, a multiple of CSLs may be selected and written on a large number of columns in a burn-in test mode.

When BIT="H" for driver SAPn, one of the pair of 10 PMOS transistors 293 . . . in the driver output stage is made inoperative to reduce the driving capacity. Such an arrangement is required to prevent any increase in the power source noise due to a raised flow rate of the BL charging current that may be given rise to as more S/As are activated in a burn-in test mode than in a normal operation mode.

The noise level is additionally suppressed as the rate at which the electric potential of the gates of the PMOS transistors 293 . . . in the driver output stage is discharged to 0V is reduced by raising the resistance of the resistor 295.

Figure 30:
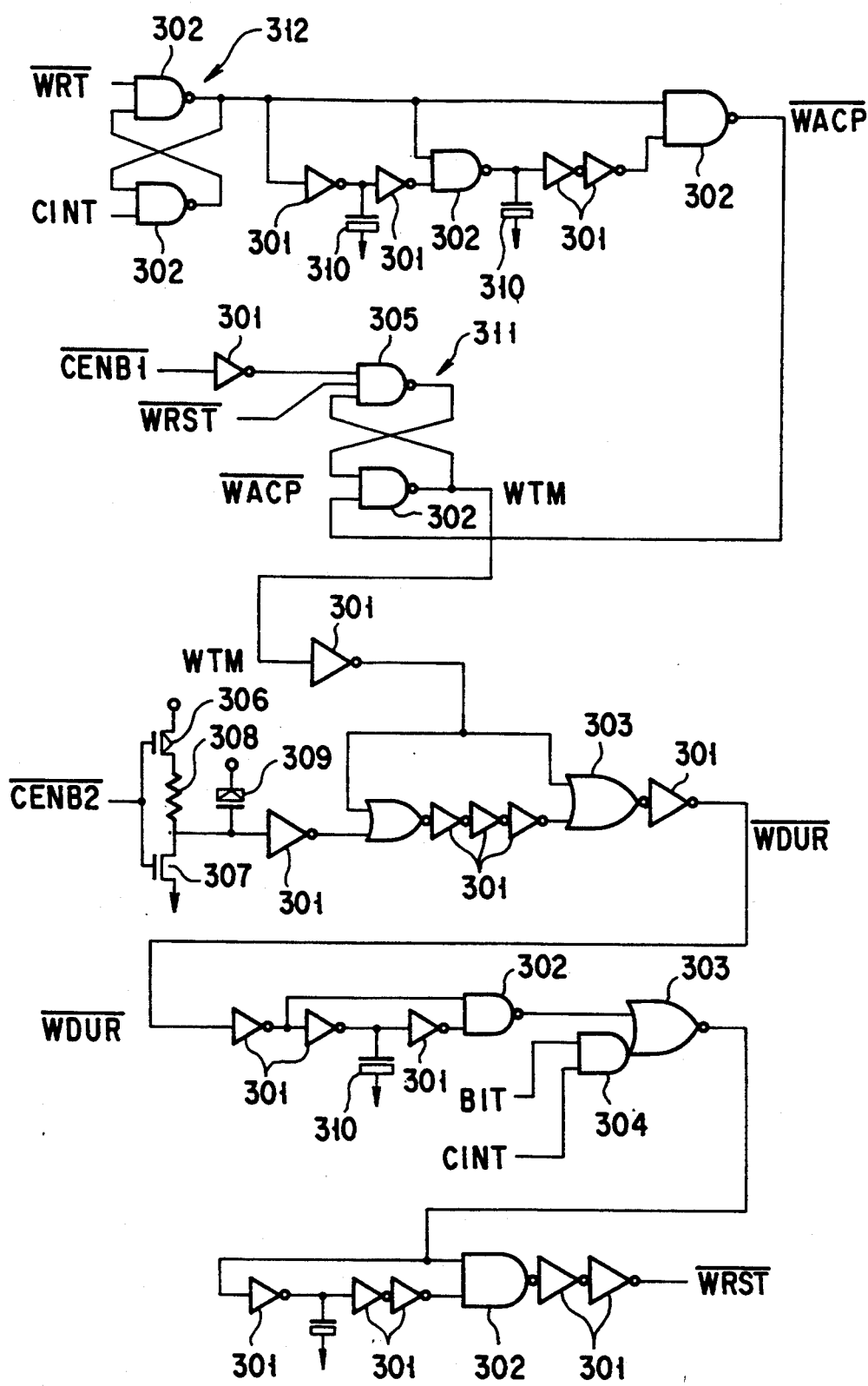
FIG. 30 is a circuit diagram of the portion of the circuit of the embodiment of FIG. 1 responsible for its write time-out feature.

FIG. 30 is a circuit diagram of the portion of the circuit of the embodiment of FIG. 1 responsible for its write time out feature.

In FIG. 30, 301 . . . are inverters, 302 is a two-input NAND gate, 303 . . . are two-input NOR-gates, 304 is a two-input AND-gate, 305 is a three input NAND gate, 306 is a PMOS transistor, 307 is an NMOS transistor, 308 is a resistor, 309 a capacitor realized by short-circuiting the drain and the source of a PMOS transistor, 310 . . . are capacitors realized by shortcircuiting the respective drains and sources of so many NMOS transistors and 311 and 312 are flip-flops.

/WRT is a signal that goes low when both CAS and WE are made low simultaneously (to show that the user wants to write data in the DRAM).

/WDUR is a signal that specifies the timing with which data are written on data lines. /WRST is a signal that resets the flip-flop 311.

The above write time-out circuit is logically so configured that it operates to automatically terminate a write period within the chip in a normal operation mode regardless of the write pulse width specified by the user. Whereas it operates to terminate a write period in synchronism with an external input signal in a burn in test mode.

Differently stated, in a normal operation mode, when /WRT goes low as the user makes both /CAS and /WE low in order to write data into the DRAM, /WACP (negative pulse) is generated to set the flip-flop 312 and make WTM rise to start a write period as illustrated in FIG. 31.

Short time thereafter, /WDUR goes low so that data are actually written in. After a certain period of time required for the data to be written in, /WRST (negative pulse) is generated to automatically terminate the write period.

On the other hand, since data are written simultaneously on a large number of columns in a burn-in test mode, the write time-out feature cannot deal with the time required for writing the data correctly.

In order to solve this problem, it is so controlled that signal /WRST that terminates a write period is not output until the precharging of /CAS (or CINT falls to a low level). With this arrangement, a write period that is sufficiently greater than that of a normal operation mode can be specified by using external signals (/WE, /CAS).

While the present invention is described above by way of an embodiment which is a DRAM, the basic concept of the present invention may be applied to other forms of semiconductor memory such as static type semiconductor memory and nonvolatile memory (EPROM and EEPROM).

As described above, the duty ratio of column selection lines can be raised as well as that of word lines so that the word lines and the column selection lines of a semiconductor memory according to the invention may be subjected to a screening test along with the peripheral circuits under a same condition for all these components (in terms of electric field and time) while operating the peripheral circuits.

Thus, the present invention provides an advancement in the circuit technology that is indispensable to realize a time saving burn-in operation for memories of the 64 MDRAM generation and make the technique of burn-in feasible for generations to come.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory comprising:
    a memory circuit including a memory cell array having memory cells arranged in rows and columns connected to word lines and column lines, column selection lines corresponding to said column lines, and peripheral circuits;
    a first means for selecting some of the word lines of said memory cell array for a voltage stress test mode, the number of said word lines selected by said first means in the voltage stress test mode being greater than the number of word lines selected in a normal operation mode; and
    a second means for selecting some of the column selection lines to thereby select the corresponding column lines of said memory cell array for a voltage stress test mode, the number of said column selection lines selected by said second means in the voltage stress test mode being greater than the number of column selection lines selected in the normal operation mode.

2. A semiconductor memory according to claim 1, in which:
    said first and second means operate in a state where the peripheral circuits are being operated.

3. A semiconductor memory according to claim 1, in which:
    said first and second means operate in a state where they can read/write in the memory cell array.

4. A semiconductor memory according to claim 1, in which:
    the drive capacity of P channel sense amplifiers comprised in said peripheral circuits for restoring column lines is made smaller in the voltage stress test mode than in the normal operation mode.

5. A semiconductor memory according to claim 2, in which:

the drive capacity of P channel sense amplifiers comprised in said peripheral circuits for restoring column lines is made smaller in the voltage stress test mode than in the normal operation mode.

6. A semiconductor memory according to claim 3, in which:

the drive capacity of P channel sense amplifiers comprised in said peripheral circuits for restoring column lines is made smaller in the voltage stress test mode than in the normal operation mode.

7. A semiconductor memory according to claim 1, in which:

said semiconductor memory is a dynamic type semiconductor memory comprising a dynamic type memory circuit; and a row address counter for CAS before RAS (CBR) automatic refreshing is comprised in said dynamic type memory circuit.

8. A semiconductor memory according to claim 2, in which:

said semiconductor memory is a dynamic type semiconductor memory comprising a dynamic type memory circuit; and a row address counter for CAS before RAS (CBR) automatic refreshing is comprised in said dynamic type memory circuit.

9. A semiconductor memory according to claim 3, in which:

said semiconductor memory is a dynamic type semiconductor memory comprising a dynamic type memory circuit; and a row address counter for CAS before RAS (CBR) automatic refreshing is comprised in said dynamic type memory circuit.

10. A semiconductor memory according to claim 1, in which:

the sense amplifiers comprised in said peripheral circuits are inactivated during a write operation in a voltage stress test mode.

11. A semiconductor memory according to claim 2, in which:

the sense amplifiers comprised in said peripheral circuits are inactivated during a write operation in a voltage stress test mode.

12. A semiconductor memory according to claim 3, in which:

the sense amplifiers comprised in said peripheral circuits are inactivated during a write operation in a voltage stress test mode.

13. A semiconductor memory according to claim 1, in which:

said memory circuits is provided with a write time out feature; and said write time out feature is prohibited during a write operation in a voltage stress test mode.

14. A semiconductor memory according to claim 2, in which:

said memory circuits is provided with a write time out feature; and said write time out feature is prohibited during a write operation in a voltage stress test mode.

15. A semiconductor memory according to claim 3, in which:

said memory circuits is provided with a write time out feature; and said write time out feature is prohibited during a write operation in a voltage stress test mode.

16. A semiconductor memory according to claim 1, in which:

said column selection lines are driven by pulses in an ordinary access mode and said column selection lines are prohibited from being driven by pulses in a voltage stress test mode so that said column selection lines may be driven for a longer period of time.

17. A semiconductor memory according to claim 2, in which:

said column selection lines are driven by pulses in an ordinary access mode and said column selection lines are prohibited from being driven by pulses in a voltage stress test mode so that said column selection lines may be driven for a longer period of time.

18. A semiconductor memory according to claim 3, in which:

said column selection lines are driven by pulses in an ordinary access mode and said column selection lines are prohibited from being driven by pulses in a voltage stress test mode so that said column selection lines may be driven for a longer period of time.

19. A semiconductor memory comprising:

a memory circuit including a memory cell array having memory cells arranged in rows and columns and connected to word lines and column lines, column selection lines corresponding to said column lines, and peripheral circuits;

a first means for selecting some of the word lines of said memory cell array, said first means being adapted to select a greater number of word lines in a voltage stress test mode than in a normal operation mode; and a second means for selecting some of the column selection lines to thereby select the corresponding columns of said memory cell array, said second means being adapted to select a greater number of column selection lines in the voltage stress test mode than in the normal operation mode;

wherein said first and second means operate in a state where said peripheral circuits are being operated, and wherein said peripheral circuits include P-channel sense amplifiers for restoring column lines having a drive capacity which is made smaller in the voltage stress test mode than in the normal operation mode.

20. A semiconductor memory comprising:

a memory circuit including a memory cell array having memory cells arranged in rows and columns and connected to word lines and column lines, column selection lines corresponding to said column lines, and peripheral circuits;

a first means for selecting some of the word lines of said memory cell array, said first means being adapted to select a greater number of word lines in a voltage stress test mode than in a normal operation mode; and a second means for selecting some of the column selection lines to thereby select the corresponding column lines of said memory cell array, said second means being adapted to select a greater number of column selection lines in the voltage stress test mode than in the normal operation mode;

wherein said first and second means operate in a state where said peripheral circuits can read/write in said memory cell array, and a drive capacity of P-channel sense amplifiers comprised in said peripheral circuits for restoring column lines is made smaller in the voltage stress test mode than in the normal operation mode.

21. A semiconductor memory according to claim 19, wherein said semiconductor memory is a dynamic type semiconductor memory comprising a dynamic type memory circuit including a row address counter for CAS before RAS (CBR) automatic refreshing.

22. A semiconductor memory according to claim 20, wherein said semiconductor memory is a dynamic type semiconductor memory comprising a dynamic type memory circuit including a row address counter for CAS before RAS (CBR) automatic refreshing.

23. A semiconductor memory according to claim 19, wherein said P-channel sense amplifiers are made inactive during a write operation in the voltage stress test mode.

24. A semiconductor memory according to claim 20, wherein said P-channel sense amplifiers are made inactive during a write operation in the voltage stress test mode.

25. A semiconductor memory according to claim 19, wherein said memory circuits are provided with a write time out feature, and said write time out feature is prohibited during a write operation in the voltage stress test mode.

26. A semiconductor memory according to claim 20, wherein said memory circuits are provided with a write time out feature, and said write time out feature is prohibited during a write operation in the voltage stress test mode.

27. A semiconductor memory according to claim 19, wherein said column selection lines are driven by pulses in the normal operation mode and said column selection lines are prohibited from being driven by said pulses in the voltage stress test mode.

28. A semiconductor memory according to claim 20, wherein said column selection lines are driven by pulses in the normal operation mode and said column selection lines are prohibited from being driven by said pulses in the voltage stress test mode.

29. A semiconductor memory device, comprising:
a row and column memory cell array including memory cells connected to word lines extending in the row direction and bit lines extending in the column direction;
sense amplifier circuitry including sense amplifiers coupled to said bit lines for sensing and amplifying data;
data lines for supplying input/output data to/from said memory cell array;
column selection circuitry responsive to column select signals for effecting a transfer of data between selected ones of said sense amplifiers and said data lines;
a first means for selecting said word lines, wherein said first selection means selects some, but not all, of said word lines in a voltage stress test mode and the number of word lines selected in the voltage stress test mode is greater than the number of word lines selected in a normal operation mode; and
a second means for generating column select signals to select some, but not all, of said sense amplifiers in the voltage stress test mode and the number of sense amplifiers selected in the voltage stress test mode is greater than the number of sense amplifiers selected in the normal operation mode.

* * * * *